US009735543B2

(12) United States Patent
Reece

(10) Patent No.: US 9,735,543 B2
(45) Date of Patent: Aug. 15, 2017

(54) OPTICAL INTERCONNECTS

(71) Applicant: EMPIRE TECHNOLOGY DEVELOPMENT LLC, Wilmington, DE (US)

(72) Inventor: Peter John Reece, Blaxland (AU)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/466,684

(22) Filed: Aug. 22, 2014

(65) Prior Publication Data

US 2016/0056603 A1 Feb. 25, 2016

(51) Int. Cl.
| H01S 3/30 | (2006.01) |
| H01S 5/00 | (2006.01) |
| H01S 3/082 | (2006.01) |
| H01S 5/14 | (2006.01) |
| G02B 6/42 | (2006.01) |
| G02B 6/02 | (2006.01) |
| H01S 5/183 | (2006.01) |

(52) U.S. Cl.
CPC .......... *H01S 5/146* (2013.01); *G02B 6/02123* (2013.01); *G02B 6/42* (2013.01); *H01S 5/1838* (2013.01); *H01S 5/18308* (2013.01); *H01S 5/18361* (2013.01); *H01S 5/18363* (2013.01)

(58) Field of Classification Search
CPC .......... H01S 3/067; H01S 3/0675; H01S 5/14; H01S 5/146; H01S 5/183
See application file for complete search history.

(56) References Cited

U.S. PATENT DOCUMENTS

| 6,088,376 A | 7/2000 | O'Brien et al. |
| 6,137,812 A | 10/2000 | Hsu et al. |
| 2003/0039024 A1* | 2/2003 | Clayton ............... H04B 10/299 359/326 |
| 2003/0072523 A1* | 4/2003 | Lin ......................... H01S 5/141 385/31 |
| 2003/0156617 A1* | 8/2003 | Baney ..................... H01S 5/146 372/96 |
| 2003/0185269 A1 | 10/2003 | Gutin |

(Continued)

OTHER PUBLICATIONS

"PV Series 850 nm VCSELs," Laser Components, accessed at http://www.lasercomponents.com/fileadmin/user_upload/home/Datasheets/pd_ld/pv85.pdf, accessed on Jul. 17, 2014, pp. 5.

(Continued)

*Primary Examiner* — Yuanda Zhang
(74) *Attorney, Agent, or Firm* — Xinova, LLC/Dorsey & Whitney LLP

(57) ABSTRACT

The present disclosure relates to methods and apparatuses for improving tolerances of in-plane optical alignment of optical interconnects. An example method includes depositing a first reflector with a first spectral reflectivity on an end of an optical fiber, coupling a laser to another end of the optical fiber, changing a spectral reflectivity of a region of the first reflector adjacent to the end of a core of the optical fiber from the first spectral reflectivity by exposure to the laser, resulting in a first reflector with multiple regions of spectral reflectivity, and coupling the first reflector to an integrated unit comprising an optical cavity deposited on a second reflector.

25 Claims, 12 Drawing Sheets

(56) References Cited

U.S. PATENT DOCUMENTS

| | | | | |
|---|---|---|---|---|
| 2004/0076208 A1* | 4/2004 | Kazarinov | ............... | H01S 5/146 372/45.01 |
| 2004/0202218 A1* | 10/2004 | Thornton | ............ | H01S 3/06716 372/50.1 |
| 2012/0027348 A1* | 2/2012 | Fattal | ...................... | H01S 5/146 385/37 |
| 2012/0327414 A1* | 12/2012 | Xu | ....................... | G01N 21/274 356/369 |
| 2013/0343420 A1* | 12/2013 | Northrup | ............ | H01S 5/18366 372/50.11 |

OTHER PUBLICATIONS

Fabes, B.D., et al., "Laser densification of optical films," SPIE, 1992, pp. 227-234, vol. 1756.

Faure, S., et al., "Relaxation and emission of Bragg-mode and cavity-mode polaritons in a ZnO microcavity at room temperature," Applied Physics Letters, Sep. 21, 2009, pp. 1-14, vol. 95.

Iga, K., "Suface-Emitting Laser—Its Birth and Generation of New Optoelectronics Field," IEEE Journal on Selected Topics in Quantum Electronics, 2000, pp. 1201-1215, vol. 6, No. 6.

Kahl, M., "Colloidal Quantum Dots in All-Dielectric High-Q Pillar Microcavities," Nano Letters, Sep. 2007, pp. 2897-2900, vol. 7, No. 9.

Keller, U. and Tropper, A. C., "Passively modelocked surface-emitting semiconductor lasers," Physics Reports, May 18, 2006, pp. 67-120, vol. 429 No. 2.

Koyama, F., "Recent Advances of VCSEL Photonics," Journal of Lightwave Technology, Dec. 2006, pp. 4502-4513, vol. 24, Issue 12.

Lidzey, D. G., et al., "Strong exciton-photon coupling in an organic semiconductor microcavity," Nature, 395, 1996, pp. 53-55.

MacLeod, H. A., "Production Methods and Thin-Film Materials," in Thin-Film Optical Filters, Fourth Edition, CRC Press, 2010, pp. 489-561.

Palen, E., "Low cost optical interconnects," Proc. of SPIE, May 2002, pp. 647804-1-647804-5, vol. 6478.

Pan, J. J., et al., "Thin films improve 50-GHz DWDM devices," Laser Focus World, May 2002, pp. 111-116, vol. 38, No. 5.

Park, H., et al., "Spatially localized one-dimensional porous silicon photonic crystals," Applied Physics Letters, 2008, pp. 011113-1-011113-3, vol. 92, Issue 1.

Wang, S-C., et al., "Optically pumped GaN-based vertical cavity surface emitting lasers: Technology and characteristics," Japanese Journal of Applied Physics, Part 1: Regular Papers and Short Notes and Review Papers, Aug. 23, 2007, pp. 5397-5407, vol. 46, No. 8B.

* cited by examiner

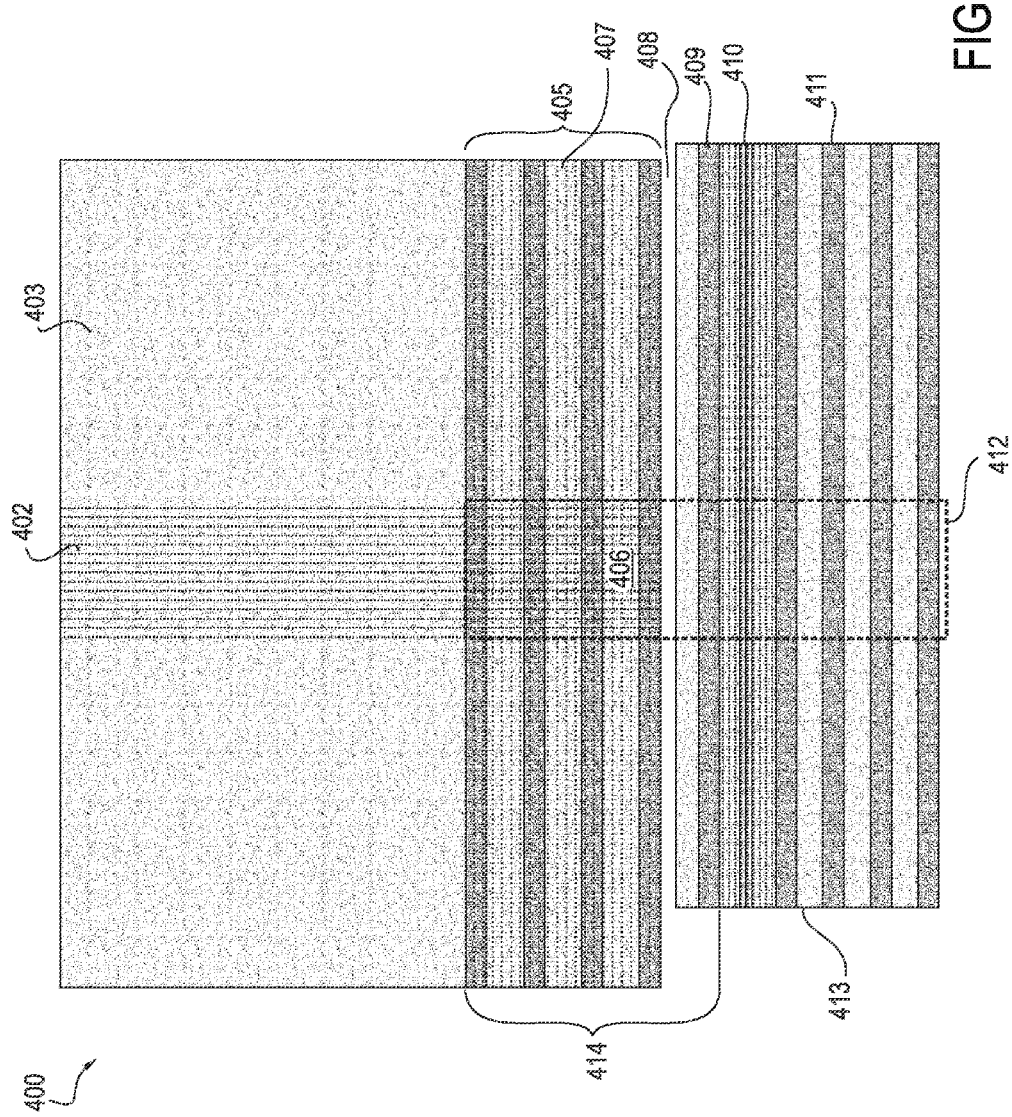

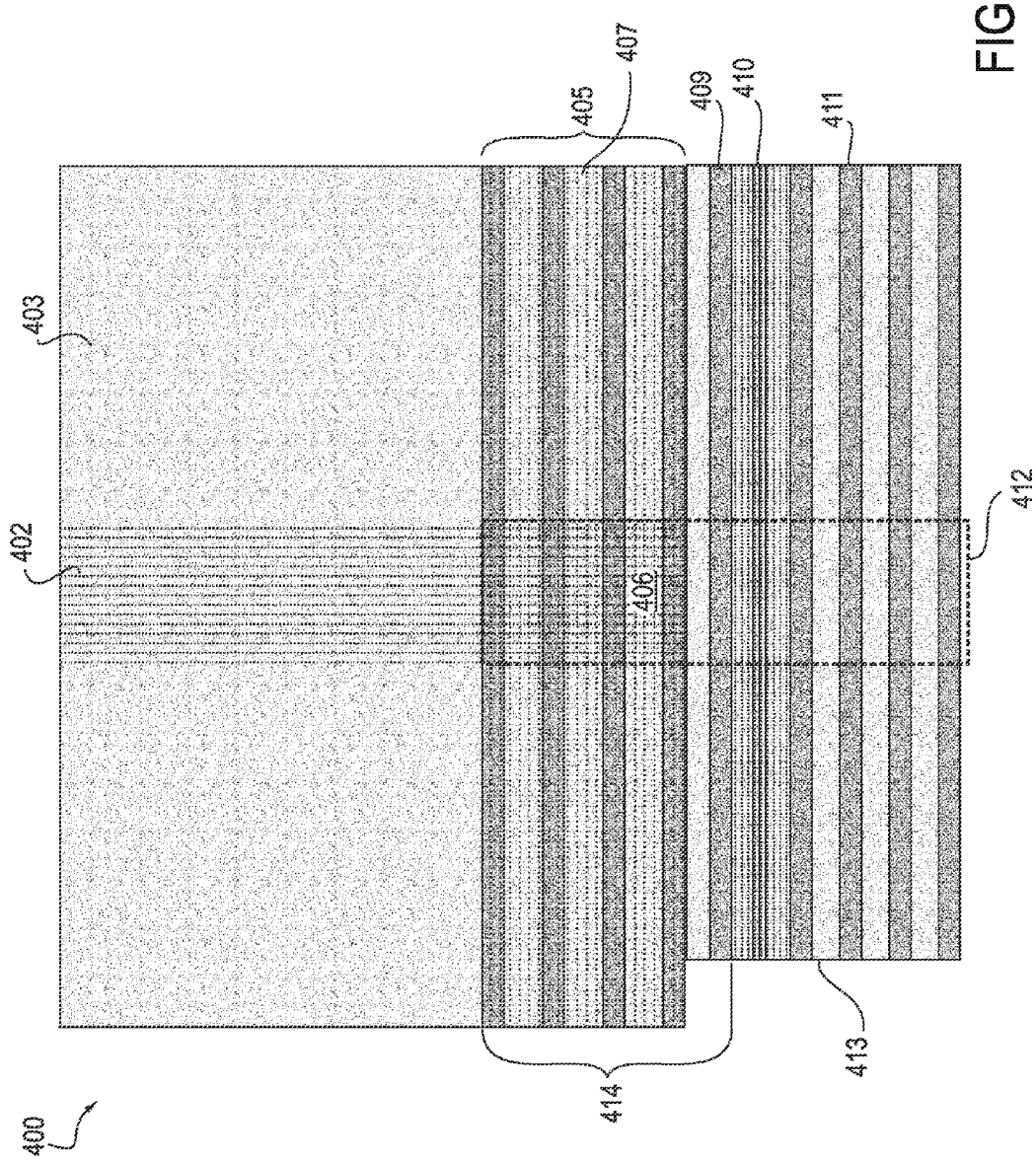

OPTICAL INTERCONNECTS

BACKGROUND

Optical interconnects for high-speed data networks typically incorporate single mode (SM) optical fibers coupled to vertical cavity surface emitting lasers (VCSELs). SM fibers are preferable over larger core, multimode fibers for high-speed optical telecommunications because they eliminate modal dispersion, which is an overriding bandwidth limitation. VCSELs are similarly well suited for high bandwidth telecommunications as they emit only in one mode, have a profile well-matched to fiber modes, have very low lasing threshold currents, and can be modulated at high speeds.

Optical interconnects between SM fibers and VCSELs involve the use of precision translation stages with active feedback for positioning the SM fiber relative to the VCSEL before fixing both in place.

SUMMARY

Techniques are generally described that include methods and apparatuses. An example method may include forming an optical interconnect. A first reflector with a first spectral reflectivity can be deposited on an end of an optical fiber. Another end of the optical fiber can then be coupled to a laser. The spectral reflectivity of the region of the first reflector adjacent to the end of a core of the optical fiber can then be changed from the first spectral reflectivity to a second spectral reflectivity by exposure to the laser, resulting in a first reflector with multiple regions of spectral reflectivity. The first reflector can then be coupled to an integrated unit comprising an optical cavity material deposited on a second reflector. The optical cavity material may be formed from multiple materials, or alternately may be formed from a single material. The second reflector may have the same second spectral reflectivity of the modified first reflector. When the first reflector is coupled to the integrated unit, lasing conditions may be met between the region of the first reflector with the second spectral reflectivity, the optical cavity material, and the second reflector. Lasing conditions may be suppressed between the region of the first reflector with the first spectral reflectivity, the optical cavity material, and the second reflector. Because lasing may be suppressed in the region of the first reflector that is not adjacent to the fiber core, the first reflector may act as an aperture that couples the entire output mode of the laser resonator into the fiber core.

In some examples, a method includes forming a laser resonator. A first reflector can be formed on an end of an optical fiber, where the optical fiber has a core and a cladding. An optical cavity material can be formed on a second reflector. The first reflector can be placed in optical contact with the optical cavity material. Laser radiation can be directed along the core of the optical fiber to irradiate the first reflector, where a first portion of the first reflector is modified by the laser radiation to form a modified first reflector. The modified first reflector, optical cavity material and second reflector form the laser resonator.

In some examples, an apparatus includes an optical fiber, a first reflector deposited on an end of the optical fiber, and an optical cavity material deposited on a surface of a second reflector. In this example, the first reflector may be configured to be placed into optical contact with a surface of the optical cavity material that is opposite to the surface on which the second reflector is deposited.

In some examples, an apparatus includes a laser. The laser includes an optical fiber having a first reflector integrated on an end of the optical fiber and an integrated unit. The integrated unit includes a second reflector and an optical cavity material. The integrated unit and the optical fiber may be in optical contact, and the optical cavity material may be located between the first reflector and the second reflector.

In some examples, an apparatus includes an optical fiber, a first reflector deposited on an end of the optical fiber, an optical cavity material deposited on the surface of a second reflector, and a third reflector deposited on the surface of the optical cavity material that is opposite to the surface adjacent to the second reflector. In this example, the first reflector and the third reflector form a combined reflector when the first reflector and the third reflector are in optical contact.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings, in which:

FIG. 4a illustrates an example of an optical interconnect including partial reflectors and an alignment gap;

FIG. 4b illustrates an example of an optical interconnect including partial reflectors and no alignment gap;

Figure 1:
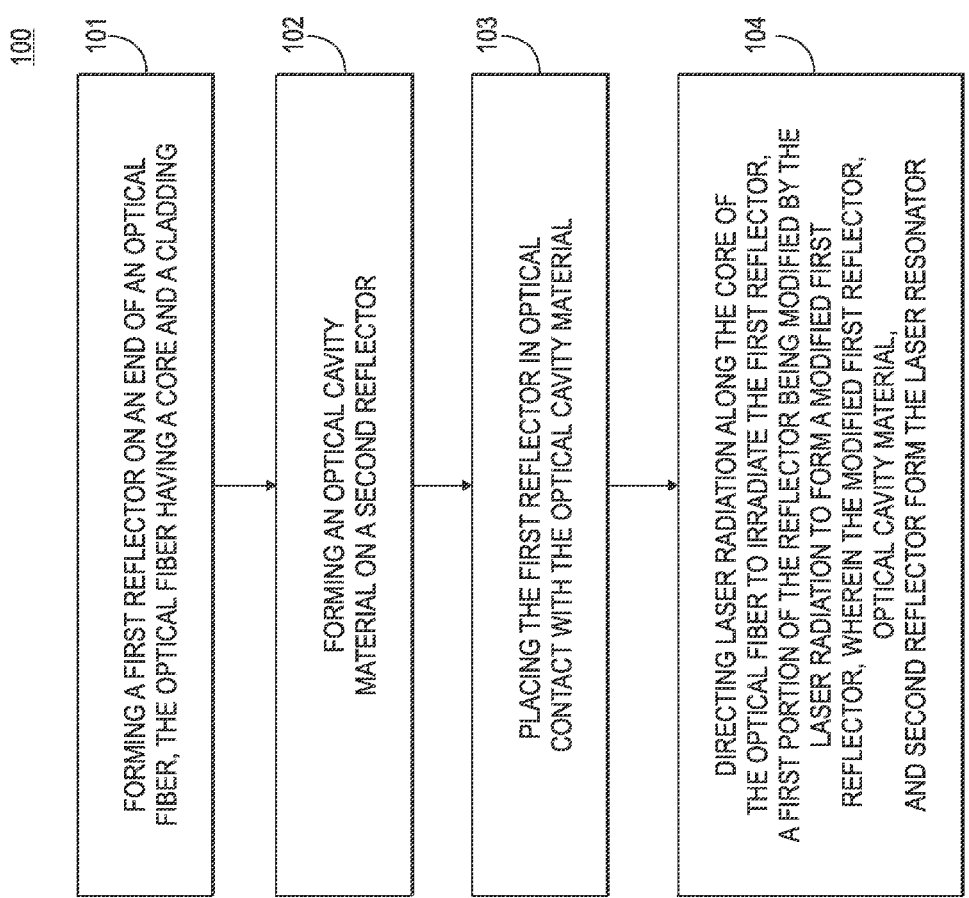
FIG. 1 is a flowchart illustrating an example method for forming a laser resonator.

all arranged in accordance with at least some embodiments of the present disclosure.

DETAILED DESCRIPTION

In the following detailed description, reference is made to the accompanying drawings, which form a part hereof. In the drawings, similar symbols typically identify similar components, unless context dictates otherwise. The illustrative examples described in the detailed description, drawings, and claims are not meant to be limiting. Other examples may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are implicitly contemplated herein.

This disclosure is drawn, inter alia, to methods, systems, products, devices, and/or apparatuses generally related to lasers and optical interconnects. Generally, optical interconnects between a laser (such as a VCSEL) and a fiber have alignment requirements for positioning the core of the fiber with the output mode of the laser. Mismatches in alignment can lead to large insertion (coupling) losses. In the worst case, if the alignment is off by the diameter of the core, light coupling may be significantly and/or completely lost. Examples described herein include systems, apparatuses, and methods where easier alignment may be facilitated between a fiber and a laser. It is to be understood that not all examples may achieve all, or even any, of the advantages described herein, including easier alignment. Advantages are instead provided for ease in understanding examples described herein.

An example of an optical interconnect according to an embodiment of the present disclosure may include an optical fiber having an end upon which a first reflector has been deposited. This first reflector can be coupled to a surface of an optical cavity material on the surface of a second reflector. When the first reflector is placed in optical contact with the surface of the optical cavity material, lasing conditions may be met and an optical interconnect may be formed.

FIG. 1 is a flowchart illustrating an example method for forming a laser resonator. An example method may include one or more operations, functions or actions as illustrated by one or more of blocks 101, 102, 103, and/or 104.

An example process 100 may begin with block 101, which recites "forming a first reflector on an end of an optical fiber, the optical fiber having a core and a cladding." Block may be followed by block 102, which recites "forming an optical cavity material on a second reflector." Block 102 may be followed by block 103, which recites "placing the first reflector in optical contact with the optical cavity material." Block 103 may be followed by block 104, which recites "directing laser radiation along the core of the optical fiber to irradiate the first reflector, a first portion of the reflector being modified by the laser radiation to form a modified first reflector, wherein the modified first reflector, optical cavity material, and second reflector form the laser resonator."

The blocks included in the described example methods are for illustration purposes. In some embodiments, the blocks may be performed in a different order. In some other embodiments, various blocks may be eliminated. In still other embodiments, various blocks may be divided into additional blocks, supplemented with other blocks, or combined together into fewer blocks. Other variations of these specific blocks are contemplated, including changes in the order of the blocks, changes in the content of the blocks being split or combined into other blocks, etc. In some examples, the first reflector may not be modified by laser radiation, and the first reflector, optical cavity material, and the second reflector will form the laser resonator.

Block 101 recites "forming a first reflector on an end of an optical fiber, the optical fiber having a core and a cladding." The optical fiber could be, for example, a single mode fiber, such as the single mode fiber 404, as pictured in FIG. 4a, or another type of fiber including but not limited to multi-mode fibers. Generally, optical fibers include a transparent core surrounded by a transparent cladding material having a lower index of refraction. The optical fiber generally acts as a waveguide to propagate optical energy along the fiber. Forming the first reflector in block 101 may be accomplished by a variety of methods including, but not limited to, evaporative coating, sputter deposition, integration of a monolithically fabricated mirror, or combinations thereof. The first reflector may generally be implemented using a material that reflects optical energy. The first reflector may also have a range of spectral reflectivity for wavelengths at which the first reflector is reflective, while remaining transmissive at other wavelengths outside of the range of spectral reflectivity. The first reflector may be a distributed Bragg reflector, or another type of reflector such as a reflective coating. The first reflector may be a partial reflector that when combined with an additional reflector may form a complete reflector. The first reflector may include alternating layers of III-V compound materials. III-V compound materials generally refer to compounds having a material from column III of the periodic table and a material from column V of the periodic table including, but not limited to, for example, gallium arsenide (GaAs), aluminum gallium arsenide (AlGaAs), or indium phosphide (InP).

Block 102 recites, "forming an optical cavity material on a second reflector." The optical cavity material may be a multi-quantum well heterostructure, for example such as gallium arsenide (GaAs), indium phosphide (InP), gallium antimonide (GaSb), indium antimonide (InSb), aluminum antimonide (AlSb), aluminum gallium arsenide (AlGaAs), or other optical gain material. The optical cavity material may be formed by a variety of techniques including, but not limited to, evaporative coating, sputter deposition, integration of a monolithically fabricated mirror, or combinations thereof. The optical cavity material may be formed from multiple materials, or alternately may be formed from a single material. The second reflector could be a distributed Bragg reflector, or another type of reflector. The second reflector may be comprised of alternating layers of III-V compound materials, such as gallium arsenide (GaAs), aluminum gallium arsenide (AlGaAs), or indium phosphide (InP). If the first reflector deposited on the optical fiber is a partial reflector, then a complementary partial reflector may also be deposited on a surface of the optical cavity material.

Block 103 recites, "placing the first reflector in optical contact with the optical cavity material." Optical contact may include a small transverse alignment gap. Optical contact may generally be achieved by bringing a surface of the first reflector into proximity with a surface of the optical cavity material such that the distance between the surfaces is small compared to the wavelength of light emitted by the laser, therefore eliminating observable optical interference fringes. The transverse alignment gap may be minimized so as to maintain resonance between the first and second reflector. The effect of the transverse alignment gap on the resonance conditions of the laser resonator can be lessened in some examples by forming the first reflector on the fiber end as a partial reflector, and forming a complementary partial reflector on the surface of the optical cavity material. The complementary partial reflector on the surface of the optical cavity material may have a low enough reflectivity so as to ensure that that lasing conditions cannot be achieved without optical contact between the partial reflector and complementary partial reflector. Still, the complementary partial reflector may have sufficiently high reflectivity so as to define the spectral position of the cavity mode of the laser resonator with respect to the second reflector. In this configuration, the resonator mode position of the laser resonator is made robust against variations in the transverse alignment gap.

Block 104 recites, "directing laser radiation along the core of the optical fiber to irradiate the first reflector, a first portion of the reflector being modified by the laser radiation to term a modified first reflector, wherein the modified first reflector, optical cavity material, and second reflector form the laser resonator." The laser radiation may then be directed along the fiber core to arrive at the first reflector. The laser radiation source may be an excimer laser source such as, for example, a krypton fluoride (KrF) source, or a xenon chloride (XeCl) source. The laser radiation source may be coupled to the fiber core at the fiber end opposite to the end of the fiber where the first reflector has been formed. The laser radiation may modify a portion of the first reflector in any of a variety of ways, which generally will change the reflective properties of regions of the first reflector that have been exposed to the laser radiation. This may include modification of the spectral reflectivity of the region of the first reflector that is adjacent to the fiber core, which may be modified to be the same spectral reflectivity as that of the second reflector. In the configuration where the first reflector is a partial reflector that has been formed on the fiber end, the exposed region of the first reflector may be modified to have the same spectral reflectivity as that of the second reflector, while the spectral reflectivity of the complementary partial reflector deposited on the optical cavity material may already have the same spectral reflectivity as that of the second reflector. The laser resonator may be formed between the regions of the first reflector and second reflector with the same spectral reflectivity. Resonant conditions may not be met in regions between the first reflector and the second reflector that have different spectral reflectivities.

Modification may be accomplished in different ways, for example, the laser radiation may photo-oxidize the portion of the first reflector that is adjacent to the fiber core. Alternately or in addition, the laser radiation may cause the region of the first reflector adjacent to the core to densify, or the laser radiation may modify the first reflector in some other way. In this manner, a reflecting portion of the first reflector may be defined by the portion modified by laser radiation from the fiber core. By utilizing optical energy delivered by the fiber core itself to create a modified portion of the first reflector, it can be ensured in some examples that the modified portion of the first reflector is aligned with the fiber core. Generally, the modified portion of the first reflector may correspond entirely with the region of the first reflector that is adjacent to the fiber core. The region of the first reflector that is adjacent to the cladding may remain unmodified, and so the spectral reflectivity of the first reflector in this region may not match the second reflector thereby suppressing lasing in this region. The alignment of this modified portion with the fiber core creates a virtual aperture for the laser resonator and ensures that the laser resonator output is coupled to the fiber core with minimal loss. The laser resonator output from the virtual aperture may not include all the light incident on the first reflector. For example, the first reflector may only pass 1% of incident light, while the remaining 99% of incident light may be reflected back toward the optical cavity material and the second reflector.

Figure 2:
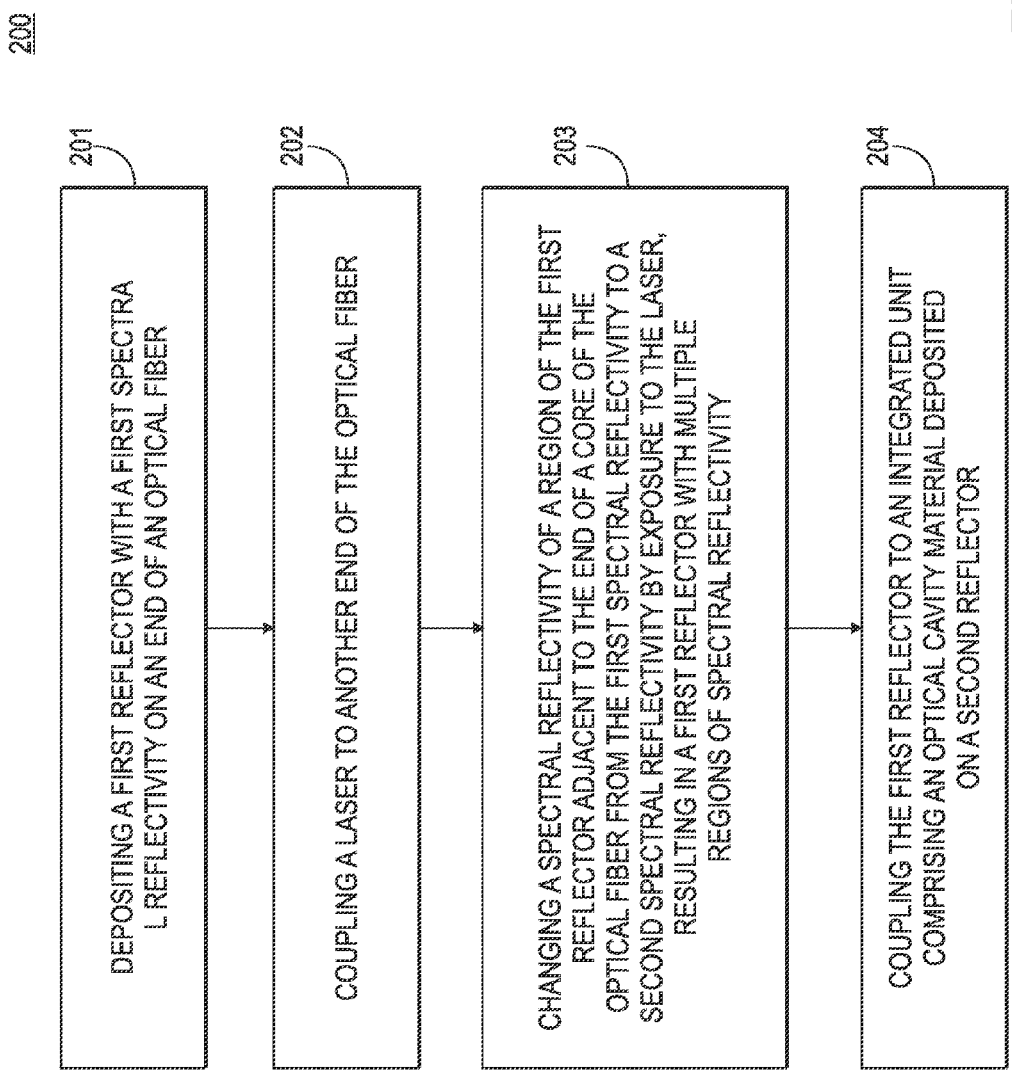
FIG. 2 is a flowchart illustrating an example method for forming an optical interconnect.

FIG. 2 is a flowchart illustrating an example method for forming an optical interconnect. An example method may include one or more operations, functions or actions as illustrated by one or more of blocks 201, 202, 203, and/or 204.

An example process 200 may begin with block 201, which recites "depositing a first reflector with a first spectral reflectivity on an end of an optical fiber." Block 201 may be followed by block 202, which recites "coupling a laser to another end of the optical fiber." Block 202 may be followed by block 203, which recites "changing a spectral reflectivity of a region of the first reflector adjacent to the end of a core of the optical fiber from the first spectral reflectivity to a second spectral reflectivity by exposure to the laser, resulting in a first reflector with multiple regions of spectral reflectivity." Block 203 may be followed by block 204, which recites "coupling the first reflector to an integrated unit comprising an optical cavity material deposited on a second reflector."

The blocks included in the described example methods are for illustration purposes. In some embodiments, the blocks may be performed in a different order. In some other embodiments, various blocks may be eliminated. In still other embodiments, various blocks may be divided into additional blocks, supplemented with other blocks, or combined together into fewer blocks. Other variations of these specific blocks are contemplated, including changes in the order of the blocks, changes in the content of the blocks being split or combined into other blocks, etc. In some examples, the first reflector may not be modified by laser radiation, and the first reflector, optical cavity material, and the second reflector will form the laser resonator.

Block 201 recites, recites "depositing a first reflector with a first spectral reflectivity on an end of an optical fiber." The optical fiber could be, for example, a single mode fiber, such as the single mode fiber 404, as pictured in FIG. 4a, or another type of fiber, including but not limited to multi-mode fibers. Generally, optical fibers include a transparent core surrounded by a transparent cladding material having a lower index of refraction than that of the core. The optical fiber generally acts as a waveguide to propagate optical energy along the fiber. Depositing the first reflector in block 201 may be accomplished by a variety of methods including, but not limited to, evaporative coating, sputter deposition, integration of a monolithically fabricated mirror, or combinations thereof. Generally, the first reflector may be implemented using a material that reflects optical energy. The first reflector may also have a range of spectral reflectivity for wavelength at which the first reflector is reflective while remaining transmissive at other wavelengths outside of the range of spectral reflectivity. The first reflector may be a distributed Bragg reflector, or another type of reflector, such as a reflective coating. The first reflector may be a partial reflector that when combined with an additional reflector may form a complete reflector. The first reflector may be comprised of alternating layers of III-V compound materials. III-V compound materials generally refer to compounds having a material from column III of the periodic table and a material from column V of the periodic table including, but not limited to for example, gallium arsenide (GaAs), aluminum gallium arsenide (AlGaAs), or indium phosphide (InP).

Block 202 recites, "coupling a laser to another end of the optical fiber." The laser could be a high intensity laser source, such as, for example, a krypton fluoride (KrF) source, or a xenon chloride source. The laser may be coupled to another end of the optical fiber for example, by using a lens. The lens may align the laser radiation from the laser along the central axis of the optical fiber core, and may also ensure that the laser radiation has the same profile as the mode that will propagate down the fiber core. The lens may be adjusted by using a translation stage, or some other adjustable optical holder. The profiles of the laser radiation and propagation mode may be described by functions of power versus radial distance from center of the radiation, and may be matched to optimize optical coupling between the laser source and the fiber in some examples.

Block 203 recites, "changing a spectral reflectivity of a region of the first reflector adjacent to the end of a core of the optical fiber from the first spectral reflectivity to a second spectral reflectivity by exposure to the laser, resulting in a first reflector with multiple regions of spectral reflectivity." The laser radiation exposure may modify a portion of the first reflector in any of a variety of ways which generally will change the reflective properties of regions of the first reflector that have been exposed to the laser radiation. This may include modification of the spectral reflectivity of the region of the first reflector that is adjacent to the fiber core, which may be modified to have the same spectral reflectivity as that of the second reflector. In the configuration where the first reflector is a partial reflector that has been formed on the fiber end, the region of the first reflector that is exposed to the laser radiation may be modified to have the same spectral reflectivity as that of the second reflectivity, while the spectral reflectivity of the complementary partial mirror on the optical cavity material may already have the same spectral reflectivity as that of the second reflector. Resonant conditions may be met in the region between region of the first reflector and the second reflector where the spectral reflectivities are the same. Resonant conditions may not be met between the region of the first reflector adjacent to the cladding and the second reflector where the spectral reflectivities are different.

Modification may be accomplished in different ways, for example, the laser radiation may photo-oxidize the region of the first reflector that is adjacent to the fiber core. Alternately, the laser radiation may cause the region of the first reflector adjacent to the fiber core to densify, or the laser radiation may modify the first reflector in some other way. In this manner, a reflecting region of the first reflector may be defined by the region of the first reflector that is modified by laser radiation from the fiber core. By utilizing optical energy delivered by the fiber core itself to create a modified region of the first reflector, it can be ensured that the modified region of the first reflector is aligned with the fiber core. Generally, the modified region of the first reflector may correspond entirely with the region of the first reflector that is adjacent to the fiber core. The region of the first reflector that is adjacent to the fiber cladding may remain unmodified, so the spectral reflectivity of this region of the first reflector may not be the same as the spectral reflectivity of the second reflector. Subsequently, lasing conditions may be suppressed in the region between the unmodified region of the first reflector and the second reflector. In this way, the alignment of the modified region of the first reflector with the fiber core creates a virtual aperture for the optical interconnect that ensures the resonant output is coupled to the fiber core with minimal loss, and that unwanted optical energy is not coupled to the fiber core in some examples. The resonant output from the virtual aperture may not include all the light incident on the first reflector. For example, the first reflector may only pass 1% of incident light, while the remaining 99% of incident light may be reflected back toward the optical cavity material and the second reflector.

Block 204 recites, "coupling the first reflector to an integrated unit comprising an optical cavity material deposited on a second reflector." The optical cavity material may be a multi-quantum well heterostructure, comprising, for example, gallium arsenide (GaAs), indium phosphide (InP), gallium antimonide (GaSh), indium antimonide (InSb), aluminum antimonide (AlSb), aluminum gallium arsenide (AlGaAs), or other optical gain materials. The optical cavity material may be formed by a variety of techniques including, but not limited to, evaporative coating, sputter deposition, integration of a monolithically fabricated mirror, or combinations thereof. The optical cavity material may be formed from multiple materials, or alternately may be formed from a single material. The second reflector may be a distributed Bragg reflector, or another type of reflector, such as a reflective coating. The second reflector may be comprised of alternating layers of II-V compound materials, for example such as gallium arsenide (GaAs), aluminum gallium arsenide (AlGaAs), or indium phosphide (InP). If the first reflector formed on the optical fiber is a partial reflector, then a complementary partial mirror may also be formed on a surface of the optical cavity material. When the first reflector is put into optical contact with the complementary partial reflector, then resonant conditions may be satisfied in the region between the modified region of the first reflector in contact with the complementary partial reflector and the second reflector. Resonant conditions may be suppressed in the region between the unmodified region of the first reflector in contact with the complementary partial reflector and the second reflector in some examples.

Coupling the first reflector to an integrated unit may include a small transverse alignment gap 408 as depicted in FIG. 4a. Coupling may be achieved through optical contact between a surface of the first reflector and a surface of the integrated unit. Optical contact may generally be accomplished by bringing a surface of the first reflector into proximity of a surface of the integrated unit such that the distance between the surfaces is small as compared to the light emitted during lasing, thereby eliminating any observable optical interference fringes. The transverse alignment gap may be minimized so as to maintain resonant conditions between the first reflector and the second reflector. The effect of the transverse alignment gap may further reduced by forming the first reflector on the fiber end as a partial reflector, and forming a complementary partial reflector on the surface of the integrated unit. The complementary partial reflector on the surface of the integrated unit may have a low enough reflectivity so as to ensure that lasing conditions cannot be achieved without optical contact between the first reflector and the integrated unit. Still, the complementary partial reflector may have sufficiently high reflectivity so as to define the spectral position of the cavity mode of the laser resonator with respect to the second reflector. In this configuration, the resonator mode position of the laser resonator is made robust against variations in the transverse alignment gap.

Figure 3:
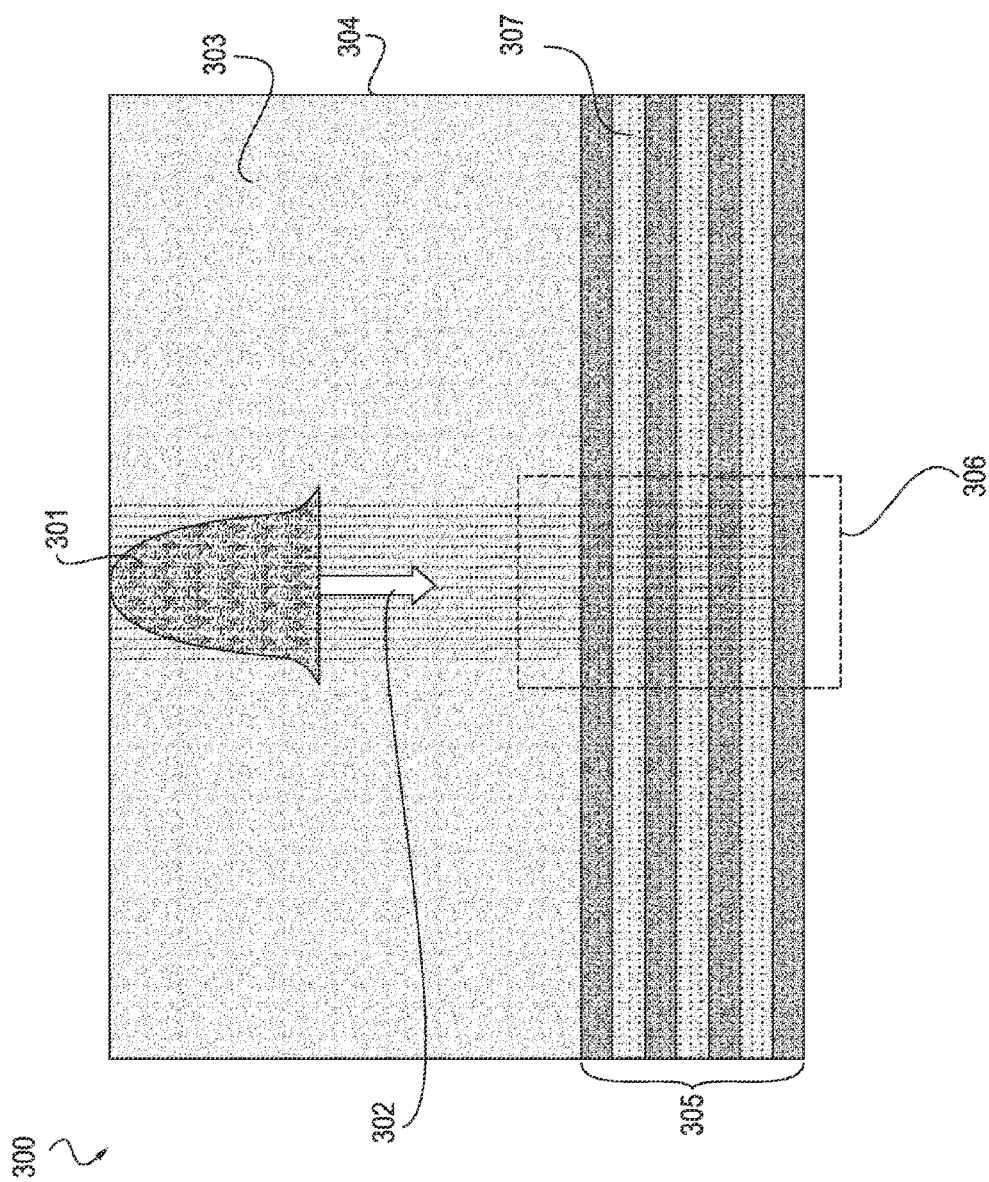
FIG. 3 illustrates an example of laser radiation modifying a reflector adjacent to the end of a fiber.

FIG. 3 is a schematic illustration of an optical interconnect component including laser radiation modifying a reflector adjacent to the end of a fiber, arranged in accordance with at least some embodiments described herein. FIG. 3 shows optical interconnect component 300, laser radiation 301, fiber core 302, fiber cladding 303, fiber 304, reflector 305, modified reflector region 306, and reflector region 307. The various components described in FIG. 3 are merely examples, and other variations, including eliminating components, combining components, and substituting components are all contemplated.

Laser radiation 301 may be coupled to fiber core 302 in order to modify reflector region 306, which is adjacent to fiber core 302. This modification of reflector region 306 may include changing the spectral reflectivity of modified reflector region 306 so that it has a different spectral reflectivity than that of reflector region 307, which is adjacent to fiber cladding 303. The spectral reflectivity of modified reflector region 306 is changed so that when optical interconnect component 300 is placed into contact with an optical gain material and a second reflector, lasing may only occur in the region between reflector region adjacent to the fiber core and the second reflector. Lasing may not occur in the region between the unmodified reflector region 307 and the second reflector. This may result in reflector 305 acting as a virtual aperture for coupling lasing output from the optical interconnect into fiber core 302 and masking unwanted optical radiation from being coupled into fiber core 302. The lasing output from the virtual aperture may not include all the light incident on the first reflector. For example, the first reflector may only pass 1% of incident light, while the remaining 99% of incident light may be reflected back toward the optical cavity material and the second reflector. Laser radiation 301 may cause modified reflector region 306 to become photo-oxidized. Alternately, laser radiation 301 may densify modified reflector region 306, or modify the reflector region in some other fashion. Reflector 305 includes both modified reflector region 306 and reflector region 307. Reflector 305 may be formed from alternating layers of III-V material such as, for example, gallium arsenide (GaAs), aluminum gallium arsenide (AlGaAs), or indium phosphide (InP). Reflector 305 may be a distributed Bragg reflector, or alternately may be another type of reflector, such as a monolithically fabricated mirror, or a reflective coating.

FIGS. 4a and 4b are schematic illustrations of an optical interconnect, arranged in accordance with at least some embodiments described herein. FIGS. 4a and 4b show optical interconnect 400, fiber core 402, fiber cladding 403, fiber 404, reflector 405, modified reflector region 406, reflector region 407, partial reflector 409, optical cavity material 410, second reflector 411, laser 412, integrated unit 413, and combined reflector 414. FIG. 4a additionally shows an alignment gap 408. The various components described in FIGS. 4a and 4b are merely examples, and other variations, including eliminating components, combining components, and substituting components are all contemplated.

Optical interconnect 400 may be configured such that laser 412 is formed when modified reflector region 406 is placed in optical contact with partial reflector 409. Optical contact between partial reflector 409 and modified reflector region 406 may create a combined reflector 414 with a spectral reflectivity region corresponding to modified reflector region 406 that has the same spectral reflectivity as that of second reflector 411. Because the spectral reflectivities are the same, lasing conditions may be satisfied in the region between modified reflector region 406 and second reflector 411. Lasing may be suppressed in the region between reflector region 407 and second reflector 411 because of differing spectral reflectivities. In this way, modified reflector region 406 and reflector region 407 may form a virtual aperture for the lasing output of optical interconnect 400 such that only the desired resonant mode may be coupled to fiber core 402, while unwanted optical radiation may be masked from coupling with the fiber core. The lasing output from the virtual aperture may not include all the light incident on the first reflector. For example, the first reflector may only pass 1% of incident light, while the remaining 99% of incident light may be reflected back toward the optical cavity material and the second reflector.

Reflector 405 and partial reflector 409 may be formed from alternating layers of III-V material such as, for example, gallium arsenide (GaAs), aluminum gallium arsenide (AlGaAs), or indium phosphide (InP). Reflector 405 and partial reflector 409 may be distributed Bragg reflectors, or alternately may be another type of reflector, such as a monolithically fabricated mirror, or a reflective coating (such as a partially reflective coating).

Optical cavity material 410 can be an optical gain medium that may be electrically or optically pumped. Optical cavity material 410 may be a multi-quantum well heterostructure, comprising, for example, gallium arsenide (GaAs), indium phosphide (InP), gallium antimonide (GaSb), indium antimonide (InSb), aluminum antimonide (AlSb), aluminum gallium arsenide (AlGaAs), or other optical gain material. The optical cavity material may be formed from multiple materials, or alternately may be formed from a single material.

Optical interconnect 400, as depicted in FIG. 4a, includes combined reflector 414 that may include an alignment gap 408 between the optical contact of reflector 405 and partial reflector 409. Optical contact may generally be accomplished by bringing a surface of reflector 405 into proximity of a surface of partial reflector 409 such that the distance between the surfaces is small as compared to the light emitted during lasing, thereby eliminating any observable optical interference fringes. Alignment gap 408 may be minimized so as to maintain resonant conditions between combined reflector 414 and second reflector 411. Partial reflector 409 may have a low enough reflectivity so as to ensure that lasing conditions cannot be achieved without optical contact between reflector 405 and partial reflector 409. Still, partial reflector 409 may have sufficiently high reflectivity so as to define the spectral position of the cavity mode of the laser 412 with respect to second reflector 411. In this configuration, the resonant mode position of the laser 412 is made robust against variations in the alignment gap 408.

FIG. 4b depicts an alternate example of optical interconnect 400 where combined reflector 414 does not include an alignment gap between reflector 405 and partial reflector 409. This may be achieved, for example, through an optical contact bond between reflector and partial reflector 409. Optical contact bonding generally refers to a process without adhesive where two closely conforming surfaces are joined together. Generally, the two surfaces in an optical contact bond are held together purely by intermolecular forces. As depicted in FIG. 4b, laser 412 in optical interconnect 400 would exhibit optimal resonant conditions because combined reflector 414 would be the optimal distance from second reflector 411.

Figure 5A:
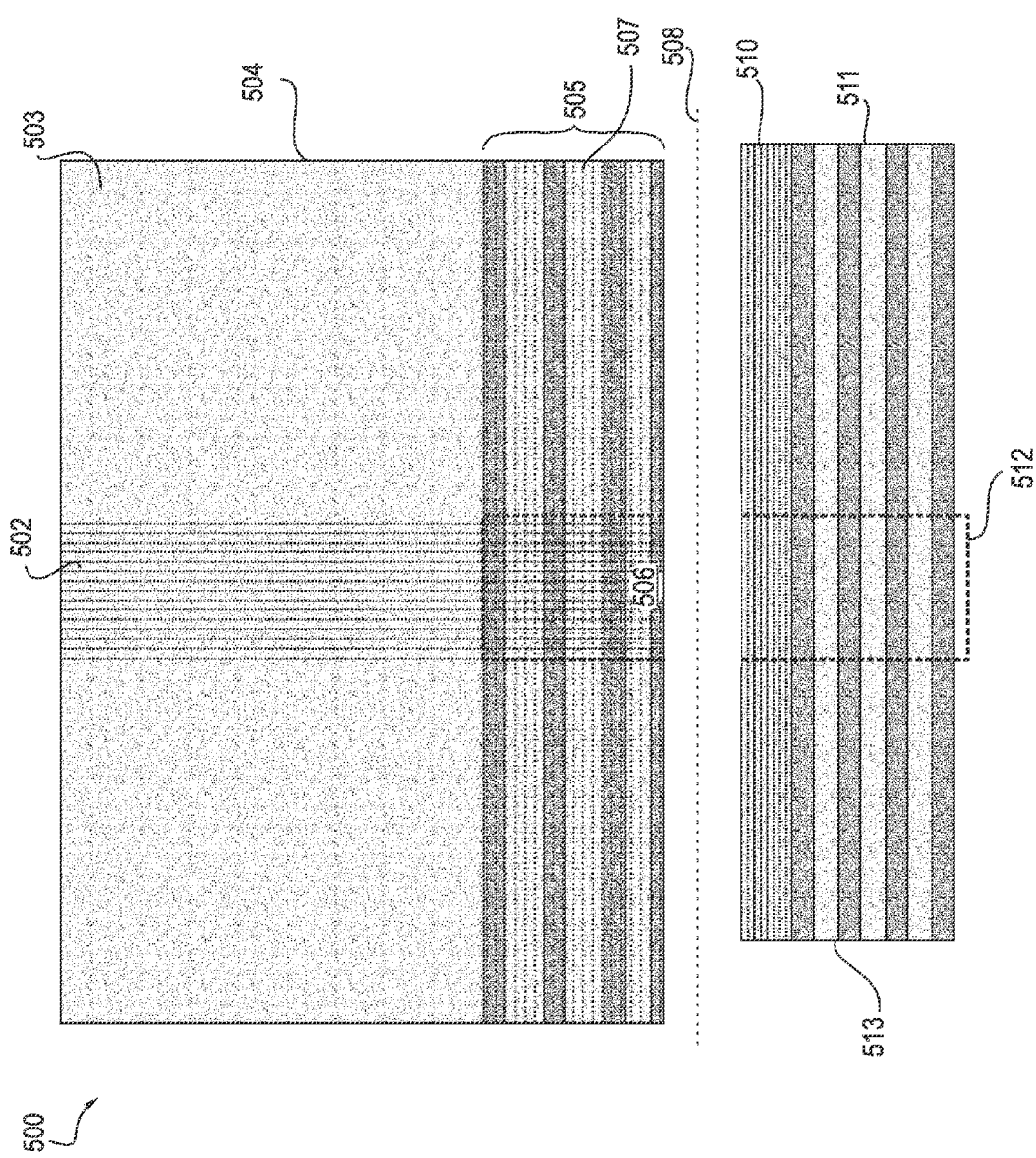
FIG. 5a illustrates an example of an optical interconnect including an alignment gap.
Figure 5B:
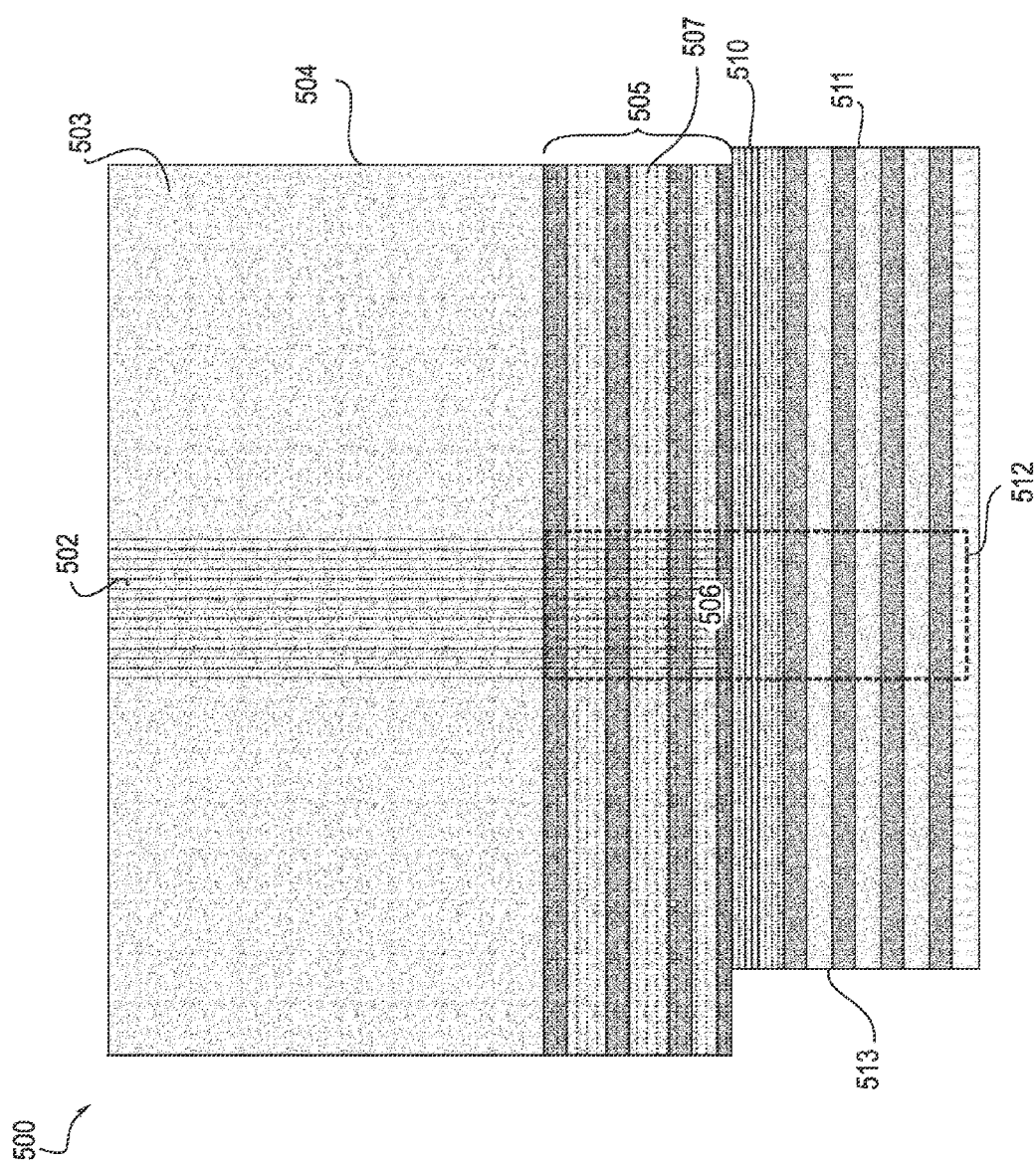
FIG. 5b illustrates an example of an optical interconnect without an alignment gap.

FIGS. 5a and 5b are schematic illustrations of an optical interconnect, arranged in accordance with at least some embodiments described herein. FIGS. 5a and 5b show optical interconnect 500, fiber core 502, fiber cladding 503, fiber 504, reflector 505, modified reflector region 506, reflector region 507, optical cavity material 510, second reflector 511, laser 512, and integrated unit 513. FIG. 5a additionally shows an alignment gap 508. The various components described in FIGS. 5a and 5b are merely examples, and other variations, including eliminating components, combining components, and substituting components are all contemplated.

Optical interconnect 500 may be configured such that laser 512 is formed when modified reflector region 506 is placed in optical contact with optical cavity material 510. Modified reflector region 506 has a spectral reflectivity that matches that of reflector 511. Reflector 505 may be formed from alternating layers of III-V material such as, for example, gallium arsenide (GaAs), aluminum gallium arsenide (AlGaAs), or indium phosphide (InP).

Optical cavity material 510 can be an optical gain medium that may be electrically or optically pumped. Optical cavity material 510 may be a multi-quantum well heterostructure such as, for example, gallium arsenide (GaAs), indium phosphide (InP), gallium antimonide (GaSb), indium antimonide (InSb), aluminum antimonide (AlSb), aluminum gallium arsenide (AlGaAs), or other optical gain material. The optical cavity material may be formed from multiple materials, or alternately may be formed from a single material Reflector 505 may be a distributed Bragg reflector, or alternately may be another type of reflector, such as a monolithically fabricated mirror, or a reflective coating.

Optical interconnect 500, as depicted in FIG. 5a, may include an alignment gap 508 in the optical contact between reflector 505 and optical cavity material 510. Optical contact may generally be accomplished by bringing a surface of reflector 505 into proximity of a surface of optical cavity material 510 such that the distance between the surfaces is small as compared to the light emitted during lasing, thereby eliminating any observable optical interference fringes. Alignment gap 508 may be minimized so as to maintain resonant conditions between reflector 505 and second reflector 511.

FIG. 5b depicts an alternate example of optical interconnect 500 wherein there is no alignment gap between reflector 505 and optical cavity material 510. This may be achieved, for example, through an optical contact bond between reflector 505 and optical cavity material 510. Optical contact bonding generally refers to a process without adhesive where two closely conforming surfaces are joined together. Generally, the two surfaces in an optical contact bond are held together purely by intermolecular forces. As depicted in FIG. 5b, laser 512 in optical interconnect 505 would exhibit optimal resonant conditions because reflector 505 would be the optimal distance from second reflector 511.

Figure 6:
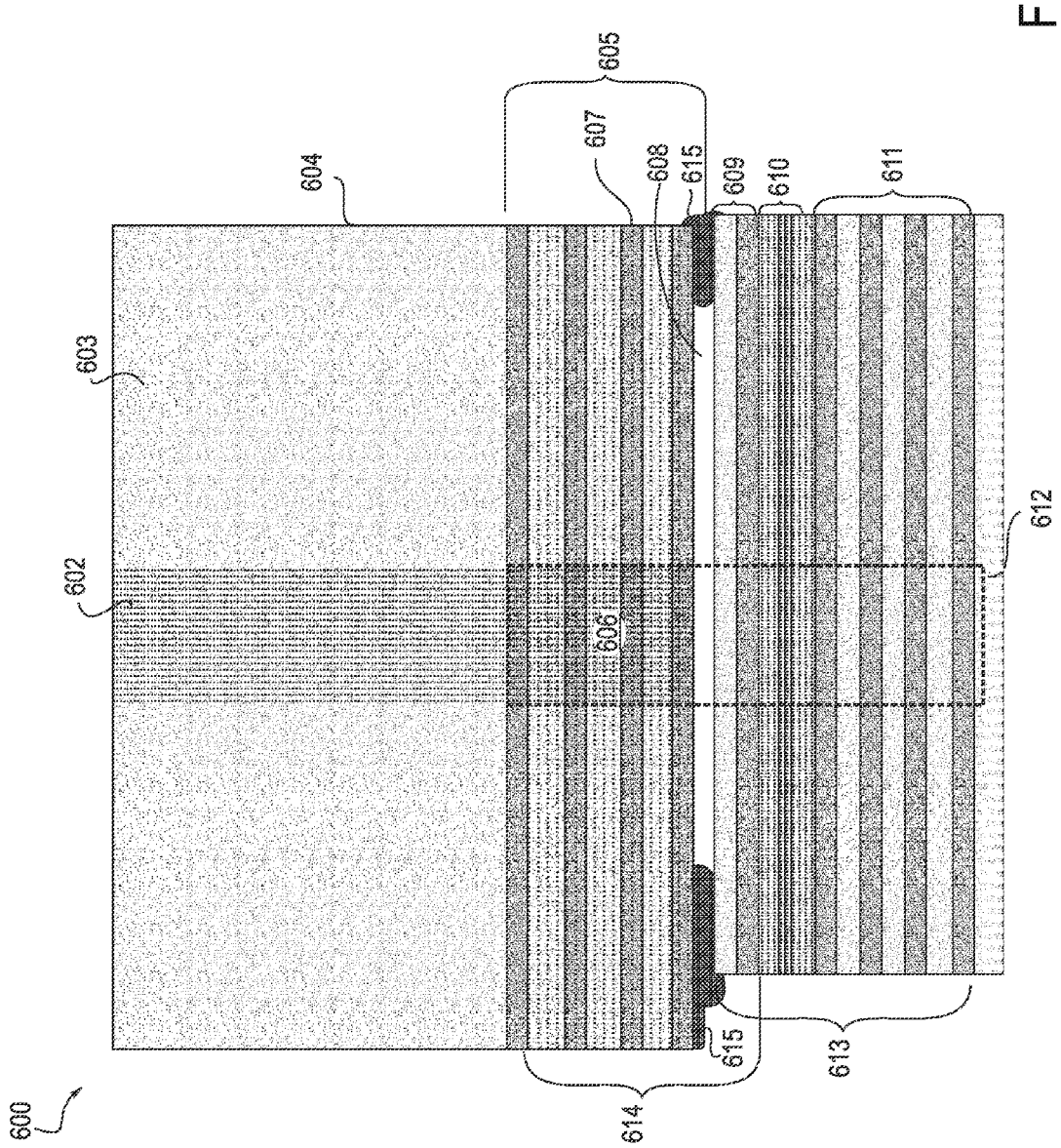
FIG. 6 illustrates an optical interconnect including optical adhesive.

FIG. 6 is a schematic illustration of an optical interconnect, arranged in accordance with at least some embodiments described herein. FIG. 6 show optical interconnect 600, fiber core 602, fiber cladding 603, fiber 604, reflector 605, modified reflector region 606, reflector region 607, alignment gap 608, partial reflector 609, optical cavity material 610, second reflector 611, laser 612, integrated unit 613, combined reflector 614, and optical adhesive 615. The various components described in FIG. 6 are merely examples, and other variations, including eliminating components, combining components, and substituting components are all contemplated.

Optical interconnect 600 may be configured such that laser 612 is formed when modified reflector region 606 is placed in optical contact with partial reflector 609. Optical contact between partial reflector 609 and modified reflector region 606 may create a combined reflector 614 with a spectral reflectivity that matches that of reflector 611. The optical contact may be made permanent by affixing reflector 605 to partial reflector 609 by optical adhesive 615. Optical adhesive 615 may, for example, be epoxy-based or acrylate-based. Alternately, reflector 605 may be connected to partial reflector 609 by an optical fiber connector, or another optical connecting device capable of mechanical fastening. While FIG. 6 depicts an alignment gap 608, as described above with respect to FIGS. 4b and 5b, alternately reflector 605 may be in optical contact bond with partial reflector 609 that may eliminate alignment gap 608. Reflector 605 and partial reflector 609 may be formed from alternating layers of III-V material such as, for example, gallium arsenide (GaAs), aluminum gallium arsenide (AlGaAs), or indium phosphide (InP). Reflector 605 and partial reflector 609 may be distributed Bragg reflectors, or alternately may be another type of reflector, such as a monolithically fabricated mirror, or a reflective coating.

Optical cavity material 610 can be an optical gain medium that may be electrically or optically pumped. Optical cavity material 610 may be a multi-quantum well heterostructure, or may be some other material. Optical cavity material 410 may be a multi-quantum well heterostructure such as, for example, gallium arsenide (GaAs), indium phosphide (InP), gallium antimonide (GaSb), indium antimonide (InSb), aluminum antimonide (AlSb), aluminum gallium arsenide (AlGaAs), or other optical gain material. The optical cavity material may be formed from multiple materials, or alternately may be formed from a single material.

In some examples, an apparatus comprises an optical fiber (for example, a single mode optical fiber), the optical fiber comprising a core and a cladding disposed around the core, a first reflector deposited on an end of the optical fiber, and an integrated unit. The integrated unit may comprise one or more semiconductor structures. In some examples, the integrated unit may comprise a substrate supporting a second reflector, and an optical cavity material located (e.g., deposited or otherwise formed) on a surface of the second reflector. The first reflector may be configured to be placed into optical contact (for example, butt-coupled) with a surface of the optical cavity material, so that the optical cavity material is located between the first and second reflectors to form, for example, a resonant cavity structure such as a laser. In some examples, a third reflector is located on the cavity material, so that the first reflector may be coupled to the third reflector) and configured so that a resonant cavity (e.g., having one or more optical resonance conditions) is created when the first reflector (or a modified first region thereof) is located in optical contact with the third reflector (e.g., proximate, substantially adjacent, or adjacent). In some examples, the resonant cavity may be configured to undergo lasing on provision of appropriate excitation, such as optical pumping and/or electrical pumping. In some examples, the optical element may further include electrodes positioned either side of the optical cavity, for example on the inner surface of reflectors, or orthogonal to the reflectors (for example, in the example of an edge-emitting structure configured so that edge emission is directed towards the reflectors.)

In some examples, the optical cavity material may comprise an organic optical gain material, an organic semiconductor gain material, or an inorganic semiconductor structure such as a multi-quantum well. The cavity material may include one or more of semiconductors. In some examples, the optical cavity material may be selected such that, as an alternative to modifying a reflector region, the optical cavity material is modified by the radiation forming a modified optical cavity region. When placed in optical contact with the reflectors as described in various embodiments, this modified optical cavity region may form a laser or optical interconnect. In some embodiments, an electrode region in electrical contact with the optical cavity material may be modified in similar manner, so that electrical pumping of the optical cavity material only occurs within a region aligned with the core.

In some examples, an apparatus may further comprise a third reflector deposited on a surface of the optical cavity material opposite to the surface on which the second reflector is deposited. The optical cavity material may be located between the first and third reflectors. However, the optical cavity material, first, and third reflectors may not be capable of lasing due to the properties of the third reflector. For example, the third reflector may be a partial reflector having insufficient reflectivity at a lasing wavelength (or over a plurality of wavelengths, such as a range). However, the first reflector and the third reflector may cooperatively form a combined reflector when the first reflector and third reflector are in optical contact. The spectral properties of the combined reflector may be similar to the spectral properties of the second reflector. In some examples, the second reflector may be an essentially total reflector, and the combined reflector may allow a fraction of incident radiation to pass through the combined reflector and into the fiber.

In some examples, an apparatus comprises an optical fiber (for example, a single mode optical fiber), the optical fiber having a core and a cladding, and a first reflector deposited (or otherwise formed and/or supported) on an end of the optical fiber. For example, the reflector may be a distributed Bragg reflector, or other layered and/or photonic structure. Radiation may be directed along the core of the optical fiber from the other end of the fiber. A first region of the first reflector may be modified by the radiation to form a modified reflector region, which may be proximate or adjacent to the core. A resonant structure, such as a laser, formed cooperatively by the modified first reflector (e.g., within a first region of the first reflector), a cavity material, and second reflector, and the laser may be configured to emit light only through the first region of the first reflector, enhancing the optical coupling to the fiber core. In some examples, the first region of the first reflector defines a laser cavity that is automatically aligned with the core of the optical fiber, facilitating the matching of fiber and laser mode profiles.

In some examples, the size (e.g., area or diameter) of the first region of the reflector may be correlated with the core diameter of the fiber. A larger core may result in a larger first region of reflector, and hence a larger output aperture for a laser. This facilitates matching of the fiber mode profile and the laser mode profile. The laser may be, for example, a half-cavity VCSEL.

In some examples, methods of aligning a laser and an optical fiber including forming one reflector and a cavity material of the laser as an optical element. The other reflector of the intended laser structure (the first reflector of various examples) may be formed separately, for example by forming the first reflector directly onto an end of the optical fiber. The first reflector may be integrated directly on the end of the optical fiber. The first reflector may then be modified so that it has modified reflective properties in a (modified) first region proximate. e.g., substantially adjacent, the fiber core. In some examples, the optical fiber is positioned so that the mirror is in optical contact (in some cases, actual contact) with the cavity material. A resonator structure, such as laser resonator, is formed between the modified portion of the first reflector and the second reflector, thus providing automatic alignment of the fiber core to the laser. In some examples, the unmodified portion of the first reflector reflectivity is not matched to the laser wavelength, so that lasing is suppressed away from the fiber core, which may facilitate maintaining an appropriate mode profile matching.

In some examples, the cavity material and second reflector may be formed on a substrate, for example as an integrated unit. The integrated unit may include a semiconductor device, and may form a semiconductor laser (e.g., a VCSEL) cooperatively with the first reflector formed on the fiber when an end of the fiber supporting the first reflector is proximate or adjacent the integrated unit. The integrated unit may include an electronic circuit configured to energize and in some examples modulate the light output of the laser assembly. The integrated unit may comprise a cavity material, which may be a single material, or comprise one or more materials or a combination thereof. The integrated unit may include an electrical connector through which an electrical signal may be applied to energize the laser, and/or to modulate a laser output. The integrated unit may include a plurality of second reflectors and a plurality of cavity materials (which may be the same or different), each first reflector being associated with one of the cavity materials and configured to cooperatively form a laser or other resonant cavity with a first reflector of an associated fiber. In some examples, approaches described herein may be used to form pigtailed devices such as pigtailed lasers.

In some examples, the first reflector may comprise a porous material, such as a porous optical material, such as a porous dielectric material. In some examples, the porous material may comprise a porous semiconductor, such as porous silicon. In some examples, a porous material may include a sol-gel material, such as a sol-gel material including silica, titania, or other metal oxide. A material component of the first reflector, such as a porous material, may be laser-densified or otherwise modified by laser or other radiation directed along the fiber core. Irradiation with laser radiation, such as pulsed laser radiation, transmitted along the fiber core allows modification of the microstructure (such as density) of the reflector or a portion thereof for example modifying a refractive index or other optical property. For example, irradiation using pulsed laser irradiation at a wavelength that is absorbed by at least a portion of the first reflector facilitates densifying at least the portion of the reflector (e.g., a layer thereof), and adjusting the optical properties of the modified reflector portion. In some examples, the first reflector may be formed by side-lithography of an end portion of the fiber. The first reflector may then be modified within a first region, co-extensive with the fiber core, by irradiation along the core.

Some examples include a fiber-pigtailed laser (such as a fiber-pigtailed VCSEL) in which substantially all or part of a first reflector of the laser is located on or within an end portion of a coupled fiber. The end portion of the fiber is placed proximate and optically coupled to the cavity material, for example, so that the first reflector is butt-coupled to the remaining laser structural elements within the integrated unit. Such approaches may enhance alignment, in some examples improving alignment and/or facilitating an alignment process. In some examples, a light emitting device such as a semiconductor light emitting diode (LED) is coupled to a fiber using an analogous approach. In some examples, a sensor, such as a semiconductor optical sensor, is coupled to a fiber using an analogous approach.

In some examples, the second mirror, cavity material, and (in some examples) a current confinement region of the laser (such as a VCSEL) may be broader in area (e.g., in lateral cross-sectional area normal to the direction of the light output) relative to the first reflector. The first reflector may function as the laser reflector only in an area substantially corresponding to that of an end of the fiber core. Modification of the first reflector may be achieved with desired spatial selectivity by irradiation of the reflector through the fiber core. For example, local modification of the first reflector in a portion near the fiber core may be achieved using laser based photo-oxidation or densification of some or all of the reflector material using laser radiation (such as pulsed laser radiation) transmitted through the fiber core from the other end of the fiber. Lasing may then occur only within a portion of the cavity material located between the fiber core and the second reflector, as the first reflector is spatially selectively modified adjacent the fiber core.

Figure 7:
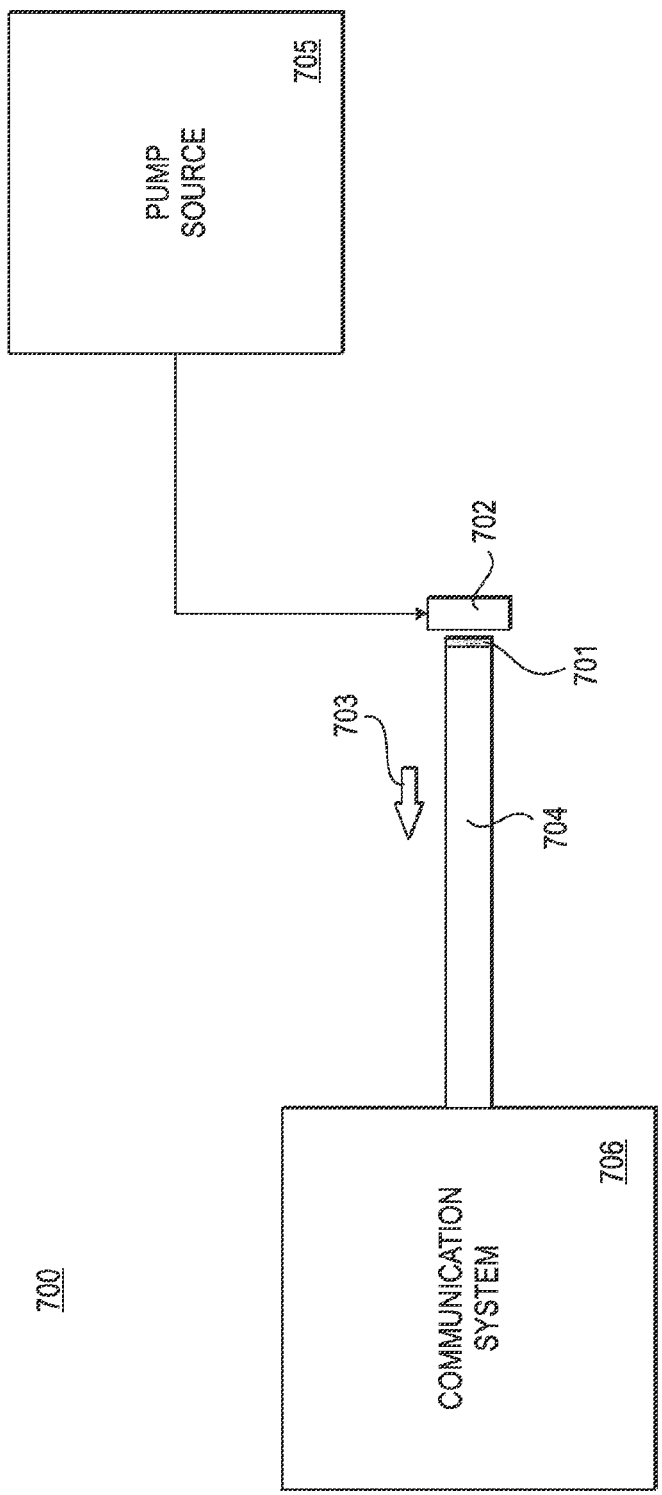
FIG. 7 illustrates an example of an optical interconnect in an operating environment.

FIG. 7 is a schematic illustration of an example system 700 in which an optical interconnect according to this disclosure may operate. FIG. 7 shows optical interconnect 701, optical integrated unit 702, optical output radiation 703, optical fiber 704, pump source 705, and communication system 706. The various components described in FIG. 7 are merely examples, and other variations, including eliminating components, combining components, and substituting components are all contemplated.

System 700 may include communication system 706, which may for example, be a high-speed optical telecommunications system. Optical interconnect 701 may interact with communication system 706 via optical output radiation 703 that transmitted by way of optical fiber 704. Optical output radiation 703 may correspond to telecommunications data to be transmitted to the communication system. As described with respect to FIGS. 1-6 above, optical interconnect 701 may contain optical integrated unit 702. Optical integrated unit 702 may be attached to a pump source 705. Pump source 705 may be an electrical current source that includes electrodes attached to the optical cavity material in optical integrated unit 702. Pump source 705 may transmit electrical current by way of these electrodes in order to electrically pump the optical cavity material and produce optical output radiation 703 from optical interconnect 701. Alternatively, pump source 705 may be an optical source configured to provide an optical pump signal for optically pumping the optical cavity material in optical integrated unit 702. Pump source 705 may then excite the optical cavity material in optical interconnect 701 to produce an optical output radiation 703 from optical interconnect 701. In this optical pumping example, pump source 705 may be a diode laser that is external to optical interconnect 701, or may be another type of external light source for optical pumping such as a discharge lamp, a gas laser, or a solid-state laser.

Figure 8:
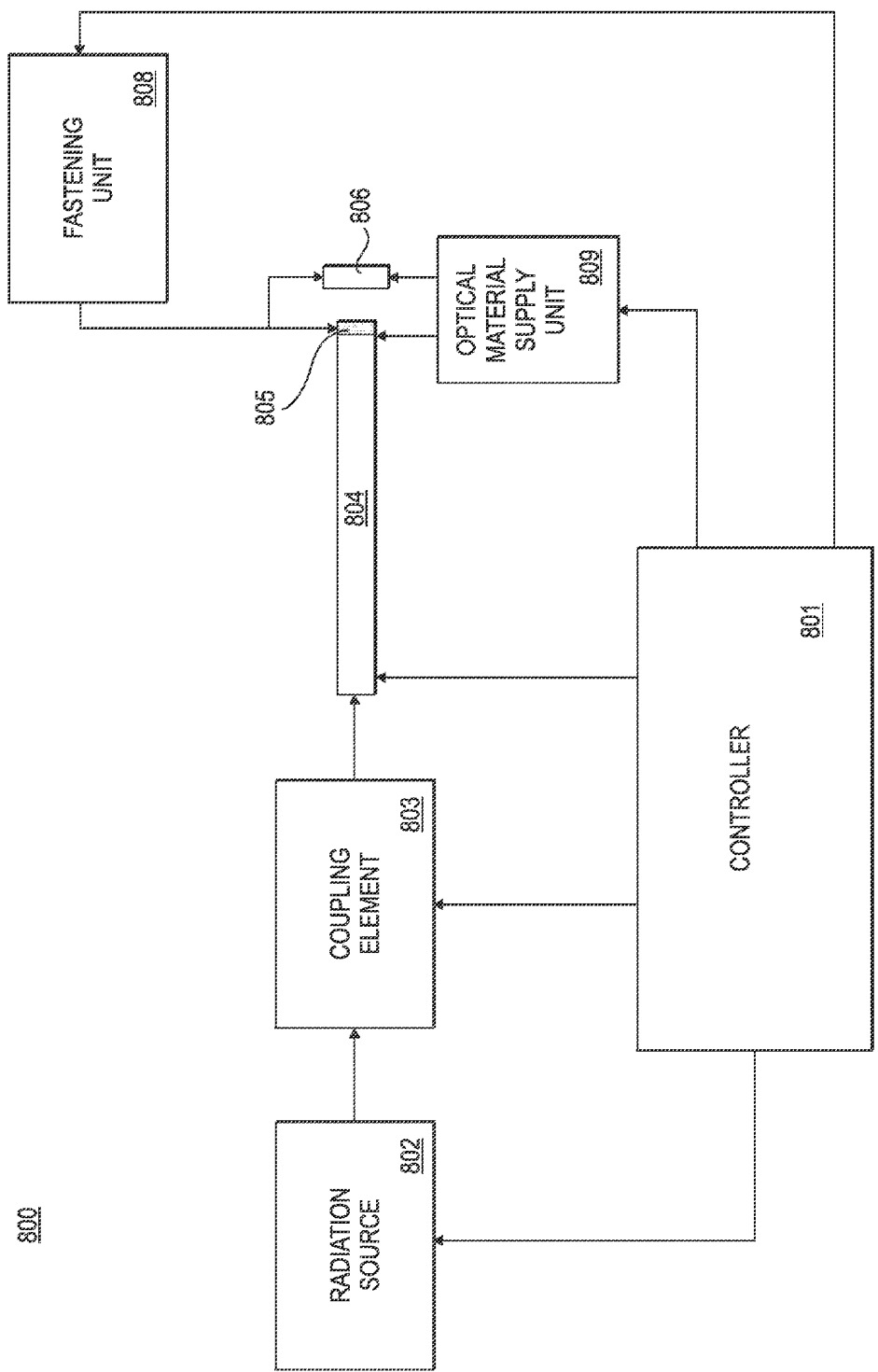
FIG. 8 illustrates an example manufacturing assembly system for assembling an optical interconnect.

FIG. 8 is a schematic illustration of an example manufacturing assembly system that is arranged for manufacturing an optical interconnect in accordance with at least some embodiments described herein. FIG. 8 shows manufacturing assembly system 800, controller 801, radiation source 802, coupling element 803, optical fiber 804, first reflector 805, optical integrated unit 806, optical interconnect 807, fastening unit 808, and optical material supply unit 809. The various components described in FIG. 8 are merely examples, and other variations, including eliminating components, combining components, and substituting components are all contemplated. Manufacturing assembly system 800 may be arranged such that controller 801 coordinates the manufacturing process for assembling and creating optical interconnect 807. Controller 801 may be implemented, for example, by computing device 900 as illustrated and described below with respect to FIG. 9.

In some examples, controller 801 may be connected to an optical material supply unit 809. Optical material supply unit 809 may implement the deposition or construction process for components that make up optical interconnect 807 including optical materials for first reflector 805 and optical integrated unit 806. As discussed above with respect to FIG. 1-7, optical integrated unit 806 may include both an optical cavity material and a second reflector. Optical material supply unit 809 may also form or deposit first reflector 805 on an end of fiber 804.

Controller 801 may be operably connected to and configured to control radiation source 802. As described with respect to FIGS. 1-7 above, radiation source 802 may be an excimer laser source such as, for example, a krypton fluoride (KrF) source, or a xenon chloride (XeCl) source. Controller 801 may also be operably connected to and configured to control coupling element 803. Coupling element 803 may be a lens, aperture, translation stage, or a combination thereof. Controller 801 may be configured to couple radiation from radiation source 802 into fiber 804. Controller 801 may be further configured to cause the positioning of fiber 804 to be adjusted to coordinate with coupling element 803. Controller may be further configured to cause radiation source 802 to emit radiation to be coupled into fiber 804 by way of coupling element 803. This radiation may modify a reflectivity of first reflector 805 to create a reflector with multiple regions of reflectivity, as described above with respect to FIGS. 1-7.

Controller 801 may be operably connected to and configured to control fastening unit 808. In some embodiments, after controller 801 has caused the modification of first reflector 805, controller 801 may move optical integrated unit 806 into position with first reflector 805 in order to form optical interconnect 807. Once optical interconnect 807 is in position, controller 801 may control fastening unit 808 to fasten first reflector 805 to optical integrated unit 806, as depicted in FIG. 6. Fastening unit 808 may apply an optical adhesive to first reflector 805 and optical integrated unit 806. The optical adhesive may, for example, be epoxy-based or acrylate-based. Alternately, fastening unit 808 may connect first reflector 805 to optical integrated unit 806 by an optical fiber connector, or another optical connecting device capable of mechanical fastening.

Figure 9:
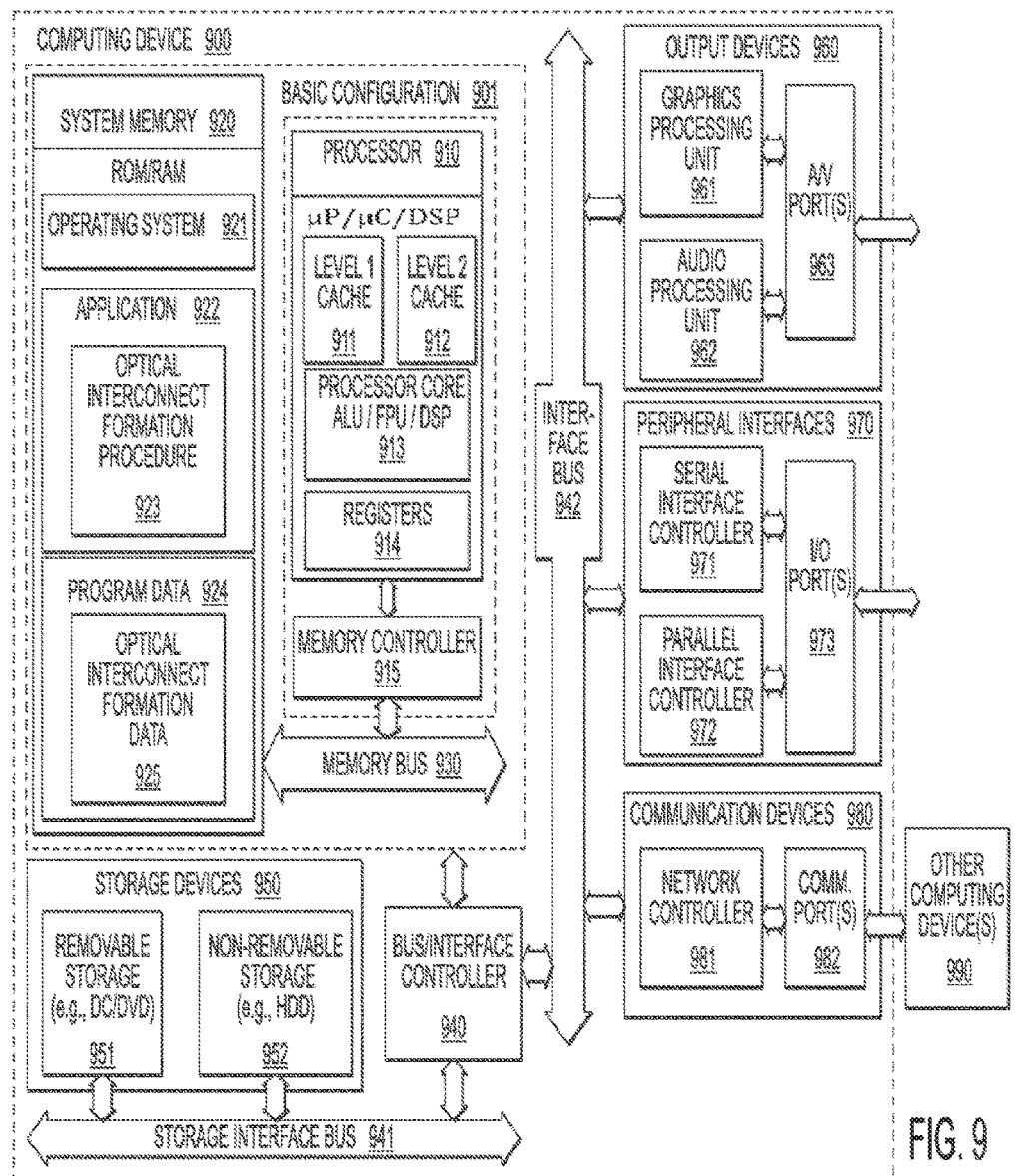
FIG. 9 is a block diagram illustrating an example computing device that is arranged for controlling a manufacturing assembly system.

FIG. 9 is a block diagram illustrating an example computing device 900 that is arranged for manufacturing an optical interconnect in accordance with the present disclosure. In a very basic configuration 901, computing device 900 typically includes one or more processors 910 and system memory 920. A memory bus 930 may be used for communicating between the processor 910 and the system memory 920.

Depending on the desired configuration, processor 910 may be of any type including but not limited to a microprocessor (μP), a microcontroller (μC), a digital signal processor (DSP), or any combination thereof. Processor 910 may include one or more levels of caching, such as a level one cache 911 and a level two cache 912, a processor core 913, and registers 914. An example processor core 913 may include an arithmetic logic unit (ALU), a floating point unit (FPU), a digital signal processing core (DSP Core), or any combination thereof. An example memory controller 915 may also be used with the processor 910, or in some implementations, the memory controller 915 may be an internal part of the processor 910.

Depending on the desired configuration, the system memory 920 may be of any type including but not limited to volatile memory (such as RAM), non-volatile memory (such as ROM, flash memory, etc.) or any combination thereof. System memory 920 may include an operating system 921, one or more applications 922, and program data 924. Application 922 may include an optical interconnect formation procedure 923 that is arranged to form an optical interconnect as described herein. Program data 924 may include optical interconnect formation data 925, and/or other information useful for the implementation of the optical interconnect formation procedure. In some embodiments, application 922 may be arranged to operate with program data 924 on an operating system 921 such that any of the procedures described herein may be performed. This described basic configuration is illustrated in FIG. 9 by those components within dashed line of the basic configuration 901.

Computing device 900 may have additional features or functionality, and additional interfaces to facilitate communications between the basic configuration 901 and any required devices and interfaces. For example, a bus/interface controller 940 may be used to facilitate communications between the basic configuration 901 and one or more storage devices 950 via a storage interface bus 941. The storage devices 950 may be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CI)) drives or digital versatile disk (DVID) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 900. Any such computer storage media may be part of computing device 900.

Computing device 900 may also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which may be configured to communicate to various external devices such as a display or speakers via one or more A/V ports 963. Example peripheral interfaces include a serial interface controller 971 or a parallel interface controller 972, which may be configured to communicate with external devices such as input devices (e.g., keyboard, mouse, pen, voice input device, touch input device, etc.) or other peripheral devices (e.g., printer, scanner, etc.) via one or more I/O ports 973. An example communication device 980 includes a network controller 981, which may be arranged to facilitate communications with one or more other computing devices 990 over a network communication link via one or more communication ports 982.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 may also be implemented as a personal computer including both laptop computer and non-laptop computer configurations.

Figure 10:
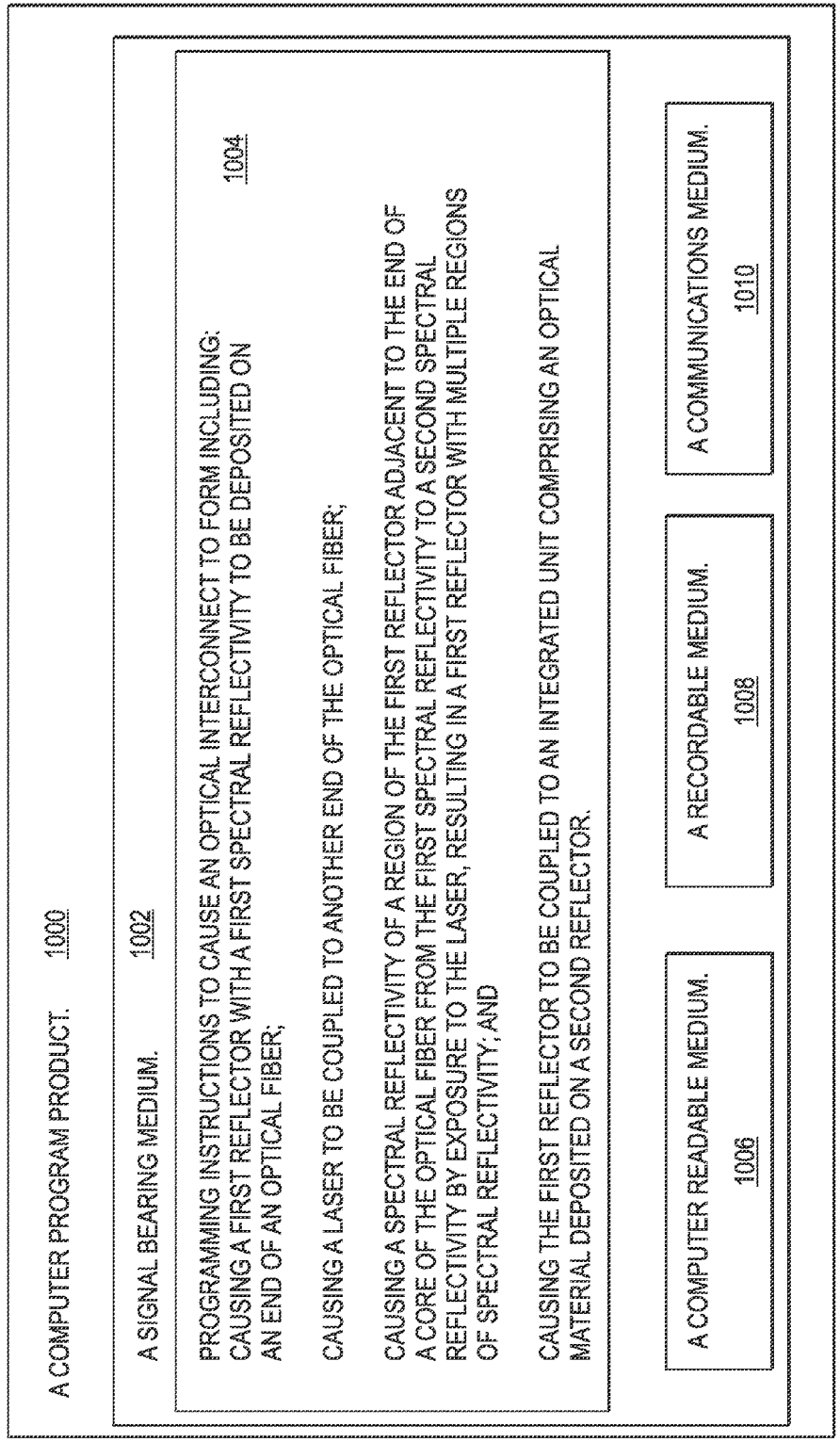
FIG. 10 is a block diagram illustrating an example computer program product that is arranged to store instructions for causing an optical interconnect to be formed.

FIG. 10 is a block diagram illustrating an example computer program product 1000 that is arranged to store instructions for an optical interconnect formation procedure in accordance with the present disclosure. The signal bearing medium 1002 which may be implemented as or include a computer readable medium 1006, a recordable medium 1008, a communications medium 1010, or combinations thereof, stores programming instructions 1004 that may configure the processing unit to perform all or some of the processes previously described. These instructions may include, for example, one or more executable instructions for causing an optical interconnect to be formed. This may include causing a first reflector with a first spectral reflectivity to be deposited on an end of a fiber. These executable instructions may further cause a laser to be coupled to another end of the optical fiber and cause a spectral reflectivity of a region of the first reflector adjacent to the end of a core of the optical fiber from the first spectral reflectivity to a second reflectivity by exposure to the laser, resulting in a first reflector with multiple regions of spectral reflectivity. The executable instructions may also cause a first reflector to be coupled to an integrated unit comprising an optical cavity material deposited on a second reflector.

In some examples, a method of forming an optical interconnect comprises depositing a first reflector with a first spectral reflectivity on an end of an optical fiber, coupling a laser (or other light source, such as a light emitting diode) to another end of the optical fiber, changing a spectral reflectivity of a region of the first reflector adjacent to the end of a core of the optical fiber from the first spectral reflectivity to a second spectral reflectivity by exposure to the laser, resulting in a first reflector with multiple regions of spectral reflectivity, and coupling the first reflector to an integrated unit comprising an optical cavity material deposited on a second reflector. A spectral reflectivity of the second reflector may substantially match the second spectral reflectivity of the first reflector, the latter as modified by exposure to the laser radiation.

In some examples, a method of forming a laser resonator comprises: forming a first reflector on an end of an optical fiber, the optical fiber having a core and a cladding; forming an optical cavity material on a second reflector, placing the first reflector in optical contact with the optical cavity material; and directing laser radiation along the core of the optical fiber to irradiate the first reflector, a first portion of the first reflector being modified by the laser radiation to form a modified first reflector, wherein the modified first reflector, optical cavity material, and second reflector form an optical resonator such as a laser resonator. In some examples, for example using a high intensity laser coupled to the opposite end of the optical fiber, the first reflector portion directly adjacent the fiber core end may be photochemically or photophysically modified (for example, photo-oxidized or densified) to modify the optical properties of a portion of the first reflector. In some examples, the optical properties of the modified portion of the first reflector are spectrally matched to the second reflector. In some examples, when the optical fiber and first reflector are brought in contact with or otherwise proximate or substantially adjacent the optical cavity material, an optical resonator condition may be satisfied only in the region adjacent to the modified first reflector, and not satisfied where the first reflector is not modified. The optical resonator may comprise the modified first reflector, the second reflector, and optical cavity material located therebetween. A laser may be formed configured to emit light directly into the core of the optical fiber, establishing optical coupling between the laser and optical fiber without need for transverse alignment. The optical cavity material may comprise an optical gain material. In some examples, a method of forming a laser resonator may further comprise electrically or optical pumping the optical cavity so that laser radiation is partially transmitted through the modified first reflector and along the optical fiber.

In some examples, an apparatus comprises: an optical fiber; a first reflector deposited on an end of the optical fiber, an optical cavity material deposited on the surface of a second reflector, a third reflector deposited on the surface of the optical cavity material that is opposite the surface adjacent to the second reflector, wherein the first reflector and the third reflector form a combined reflector when the first reflector and the third reflector are in optical contact. In some examples, there may be an alignment gap between the first and third reflector in optical contact.

The present disclosure is not to be limited in terms of the particular examples described in this application, which are intended as illustrations of various aspects. Many modifications and examples can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and examples are intended to fall within the scope of the appended claims. The present disclosure includes the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular examples only, and is not intended to be limiting.

With respect to the use of substantially any plural and/or singular terms herein, those having skill in the art can translate from the plural to the singular and/or from the singular to the plural as is appropriate to the context and or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g. "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." ii used, in general, such a construction is intended in the sense one having skill in the art would understand the convention (e.g., "a system having at least one of A, B, or C" would include but not be limited to systems that have A alone, B alone, C alone, A and B together. A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 items refers to groups having 1, 2, or 3 items. Similarly, a group having 1-5 items refers to groups having 1, 2, 3, 4, or 5 items, and so forth.

While the foregoing detailed description has set forth various examples of the devices and/or processes via the use of block diagrams, flowcharts, and/or examples, such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one example, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the examples disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. For example, if a user determines that speed and accuracy are paramount, the user may opt for a mainly hardware and/or firmware vehicle; if flexibility is paramount, the user may opt for a mainly software implementation; or, yet again alternatively, the user may opt for some combination of hardware, software, and/or firmware.

In addition, those skilled in the art will appreciate that the mechanisms of the subject matter described herein are capable of being distributed as a program product in a variety of forms, and that an illustrative example of the subject matter described herein applies regardless of the particular type of signal bearing medium used to actually carry out the distribution. Examples of a signal bearing medium include, but are not limited to, the following: a recordable type medium such as a floppy disk, a hard disk drive (HDD), a Compact Disc (CD), a Digital Video Disk (DVD), a digital tape, a computer memory, etc.; and a transmission type medium such as a digital and/or an analog communication medium (e.g., a fiber optic cable, a waveguide, a wired communication link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While various aspects and examples have been disclosed herein, other aspects and examples will be apparent to those skilled in the art. The various aspects and examples disclosed herein are for purposes of illustration and are not intended to be limiting, with the true scope and spirit being indicated by the following claims.

What is claimed is:

1. An apparatus comprising:
   an optical fiber that comprises a core;
   a first reflector deposited at an end of the optical fiber;
   an optical cavity material deposited on a surface of a second reflector; and
   a third reflector deposited on an optical cavity surface of the optical cavity material that is opposite to the surface of the second reflector,
   wherein the end of the optical fiber is proximate to the optical cavity material, and the end of the optical fiber is closer to the optical cavity material than a second end of the optical fiber is,
   wherein the first reflector is configured to be placed into optical contact with the optical cavity surface,
   wherein the first reflector and the third reflector form a combined reflector when the first reflector and the third reflector are in optical contact, and
   wherein a combined spectral reflectivity of the first reflector and the third reflector in optical contact is same as spectral reflectivity of the second reflector.

2. The apparatus of claim 1, wherein the third reflector is a partial reflector.

3. The apparatus of claim 1, wherein a resonance condition is created when the first reflector and the third reflector are in optical contact.

4. The apparatus of claim 3, further comprising an alignment gap between the first reflector and the third reflector in optical contact.

5. The apparatus of claim 1, wherein the optical fiber is a single mode optical fiber.

6. The apparatus of claim 1, wherein the first reflector, the optical cavity material, and the second reflector are configured to form a laser.

7. The apparatus of claim 6, wherein the laser is configured to emit light through the optical fiber.

8. The apparatus of claim 1, wherein the optical fiber has a cladding, wherein the cladding surrounds the core, wherein the first reflector has a first portion adjacent to the core, and a second portion adjacent to the cladding, and
wherein the first portion has a different spectral reflectivity than that of the second portion.

9. The apparatus of claim 8, wherein the first portion is photo-oxidized, and the second portion is not photo-oxidized.

10. The apparatus of claim 1, wherein the optical cavity material comprises a multi-quantum well heterostructure.

11. The apparatus of claim 1, wherein each reflector comprises alternating layers of compound materials.

12. The apparatus of claim 1, wherein each reflector comprises a distributed Bragg reflector.

13. The apparatus of claim 1, wherein the first reflector is deposited at the end of the optical fiber by evaporative coating, sputter deposition, integration of a monolithically fabricated mirror, or combinations thereof.

14. A laser comprising:
an optical fiber that has a first reflector integrated at an end of the optical fiber; and
an integrated unit proximate to the end of the optical fiber, wherein the integrated unit comprises:
a second reflector;
an optical cavity material deposited on a surface of the second reflector; and
a third reflector deposited on an optical cavity surface of the optical cavity material that is opposite to the surface of the second reflector;
wherein the integrated unit and the optical fiber are in optical contact,
wherein the optical cavity material is located between the first reflector and the second reflector,
wherein the first reflector covers a cladding and a core of the end of the optical fiber, and
wherein a spectral reflectivity over a range of wavelengths of a first region of the first reflector adjacent to the core is same as a spectral reflectivity over the range of wavelengths of the second reflector.

15. The laser of claim 14, wherein the first region of the first reflector adjacent to the core has a different spectral reflectivity than a second region of the first reflector adjacent to the cladding.

16. The laser of claim 15, wherein a cross-sectional area of the first region of the first reflector adjacent to the core is in alignment with a cross-sectional area of the core.

17. The laser of claim 14, wherein the first reflector and the second reflector comprise distributed Bragg reflectors.

18. The laser of claim 14, wherein each reflector comprises alternating layers of III-V compound materials.

19. The laser of claim 14, wherein the optical cavity material comprises a multi-quantum well heterostructure.

20. The laser of claim 14, wherein a combined spectral reflectivity of the first reflector and the third reflector in optical contact is the same as the spectral reflectivity of the second reflector.

21. The laser of claim 20, further comprising an alignment gap between the first reflector and the third reflector in optical contact.

22. The laser of claim 14, wherein the laser is a vertical cavity surface emitting layer (VCSEL).

23. The laser of claim 14, wherein the laser is configured to output laser radiation through the optical fiber.

24. The laser of claim 14, wherein the laser is configured to receive a pump beam to optically pump the optical cavity material in order to achieve lasing.

25. The laser of claim 14, further comprising electrodes configured to electrically pump the optical cavity material with an injection current in order to achieve lasing.

* * * * *

UNITED STATES PATENT AND TRADEMARK OFFICE
CERTIFICATE OF CORRECTION

PATENT NO. : 9,735,543 B2
APPLICATION NO. : 14/466684
DATED : August 15, 2017
INVENTOR(S) : Reece It is certified that error appears in the above-identified patent and that said Letters Patent is hereby corrected as shown below:

In the Specification

In Column 2, Line 59, delete "formed." and insert -- formed, --, therefor.

In Column 3, Line 44, delete "Block may" and insert -- Block 101 may --, therefor.

In Column 5, Line 12, delete "term" and insert -- form --, therefor.

In Column 6, Line 56, delete "I11-V" and insert -- III-V --, therefor.

In Column 6, Line 60, delete "limited to" and insert -- limited to, --, therefor.

In Column 8, Line 6, delete "(GaSh)" and insert -- (GaSb) --, therefor.

In Column 8, Line 17, delete "II-V" and insert -- III-V --, therefor.

In Column 10, Line 45, delete "reflector and" and insert -- reflector 405 and --, therefor.

In Column 11, Line 12, delete "(AISb)," and insert -- (A1Sb), --, therefor.

In Column 13, Line 55, delete "proximate. e.g.," and insert -- proximate, e.g., --, therefor.

In Column 14, Line 33, delete "portion therof" and insert -- portion thereof, --, therefor.

In Column 15, Line 45, delete "system that" and insert -- system 800 that --, therefor.

In Column 16, Lines 15-16, delete "Controller may" and insert -- Controller 801 may --, therefor.

In Column 17, Line 21, delete "compact disk (CI)) drives or digital versatile disk (DVID)" and insert -- compact disk (CD) drives or digital versatile disk (DVD) --, therefor.

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,735,543 B2

In Column 17, Lines 47-48, delete "peripheral interfaces" and insert -- peripheral interfaces 970 --, therefor.

In Column 18, Line 57, delete "reflector, placing" and insert -- reflector; placing --, therefor.

In Column 19, Lines 24-25, delete "fiber," and insert -- fiber; --, therefor.

In Column 19, Line 26, delete "reflector, a" and insert -- reflector; a --, therefor.

In Column 19, Line 54, delete "and or" and insert -- and/or --, therefor.

In Column 20, Line 12, delete "(e.g." and insert -- (e.g., --, therefor.

In Column 20, Line 18, delete "of"two" and insert -- of "two --, therefor.

In Column 20, Line 30, delete "ii used," and insert -- is used, --, therefor.

In Column 20, Line 34, delete "together. A" and insert -- together, A --, therefor.

In the Claims

In Column 23, Line 16, in Claim 11, delete "of compound" and insert -- of III-V compound --, therefor.